United States Patent
Stapleton et al.

(10) Patent No.: US 11,006,343 B2
(45) Date of Patent: *May 11, 2021

(54) DISTRIBUTED ANTENNA SYSTEM

(71) Applicant: Dali Wireless, Inc., Menlo Park, CA (US)

(72) Inventors: Shawn Patrick Stapleton, Vancouver (CA); Paul Lemson, Woodinville, WA (US); Bin Lin, Burnaby (CA); Albert S. Lee, San Mateo, CA (US)

(73) Assignee: DALI WIRELESS, INC., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,860

(22) Filed: May 13, 2019

(65) Prior Publication Data

US 2020/0092787 A1    Mar. 19, 2020

Related U.S. Application Data

(63) Continuation of application No. 16/059,434, filed on Aug. 9, 2018, now Pat. No. 10,334,499, which is a
(Continued)

(51) Int. Cl.
*H04W 40/02* (2009.01)
*H03F 1/32* (2006.01)
(Continued)

(52) U.S. Cl.
CPC .......... *H04W 40/02* (2013.01); *H03F 1/3247* (2013.01); *H03F 3/24* (2013.01);
(Continued)

(58) Field of Classification Search
CPC .. H04W 40/02; H04L 25/0334; H04B 1/0475; H04B 7/022
See application file for complete search history.

(56) References Cited

U.S. PATENT DOCUMENTS

| 4,755,795 A | 7/1988 | Page |
| 4,999,831 A | 3/1991 | Grace |
(Continued)

FOREIGN PATENT DOCUMENTS

| CN | 1524390 A | 8/2004 |
| CN | 1774094 A | 5/2006 |
(Continued)

OTHER PUBLICATIONS

ADC Digivance "Street-Level Coverage Solution (SCS)" Aug. 2005 (8 pages).
(Continued)

*Primary Examiner* — Wei Zhao
(74) *Attorney, Agent, or Firm* — Artegis Law Group, LLP

(57) ABSTRACT

The present disclosure is a novel utility of a software defined radio (SDR) based Distributed Antenna System (DAS) that is field reconfigurable and support multi-modulation schemes (modulation-independent), multi-carriers, multi-frequency bands and multi-channels. The present invention enables a high degree of flexibility to manage, control, enhance, facilitate the usage and performance of a distributed wireless network such as Flexible Simulcast, automatic traffic load-balancing, network and radio resource optimization, network calibration, autonomous/assisted commissioning, carrier pooling, automatic frequency selection, frequency carrier placement, traffic monitoring, traffic tagging, pilot beacon, etc. As a result, a DAS in accordance with the present invention can increase the efficiency and traffic capacity of the operators' wireless network.

22 Claims, 8 Drawing Sheets

Related U.S. Application Data continuation of application No. 15/223,819, filed on Jul. 29, 2016, now Pat. No. 10,080,178, which is a continuation of application No. 14/800,515, filed on Jul. 15, 2015, now Pat. No. 9,419,837, which is a continuation of application No. 14/260,145, filed on Apr. 23, 2014, now Pat. No. 9,137,078, which is a continuation of application No. 13/211,247, filed on Aug. 16, 2011, now Pat. No. 8,737,300.

(60) Provisional application No. 61/439,940, filed on Feb. 7, 2011.

(51) Int. Cl.

| | | |
|---|---|---|
| *H03F 3/24* | (2006.01) | |
| *H04L 25/03* | (2006.01) | |
| *H04L 27/36* | (2006.01) | |
| *H04W 88/08* | (2009.01) | |
| *H04W 24/02* | (2009.01) | |
| *H04B 1/04* | (2006.01) | |
| *H04W 24/04* | (2009.01) | |
| *H04W 40/00* | (2009.01) | |
| *H04L 27/26* | (2006.01) | |
| *H04W 72/04* | (2009.01) | |
| *H04B 7/022* | (2017.01) | |

(52) U.S. Cl.
CPC ........... *H04B 1/0475* (2013.01); *H04B 7/022* (2013.01); *H04L 25/03343* (2013.01); *H04L 27/2618* (2013.01); *H04L 27/362* (2013.01); *H04W 24/02* (2013.01); *H04W 24/04* (2013.01); *H04W 40/00* (2013.01); *H04W 72/04* (2013.01); *H04W 72/0453* (2013.01); *H04W 88/085* (2013.01); *H03F 2200/336* (2013.01); *H03F 2200/57* (2013.01); *H03F 2201/3224* (2013.01); *H03F 2201/3233* (2013.01); *H04B 2001/0425* (2013.01); *H04L 2025/03414* (2013.01)

(56) References Cited

U.S. PATENT DOCUMENTS

| | | |
|---|---|---|
| 5,457,557 A | 10/1995 | Zarem et al. |
| 5,579,341 A | 11/1996 | Smith et al. |
| 5,619,202 A | 4/1997 | Wilson et al. |
| 5,621,730 A | 4/1997 | Kelley |
| 5,627,879 A | 5/1997 | Russell et al. |
| 5,644,622 A | 7/1997 | Russell et al. |
| 5,748,683 A | 5/1998 | Smith et al. |
| 5,794,153 A | 8/1998 | Ariyavisitakul et al. |
| 5,818,883 A | 10/1998 | Smith et al. |
| 5,852,651 A | 12/1998 | Fischer et al. |
| 5,880,863 A | 3/1999 | Rideout et al. |
| 6,005,506 A | 12/1999 | Bazarjani et al. |
| 6,005,884 A | 12/1999 | Cook et al. |
| 6,014,366 A | 1/2000 | Ichiyoshi |
| 6,112,086 A | 8/2000 | Wala |
| 6,253,094 B1 | 6/2001 | Shmutz |
| 6,266,531 B1 | 7/2001 | Zadeh et al. |
| 6,353,600 B1 | 3/2002 | Schwartz et al. |
| 6,356,369 B1 | 3/2002 | Farhan |
| 6,373,611 B1 | 4/2002 | Farhan et al. |
| 6,393,007 B1 | 5/2002 | Haartsen |
| 6,445,688 B1 | 9/2002 | Garces et al. |
| 6,493,335 B1 | 12/2002 | Darcie et al. |
| 6,594,496 B2 | 7/2003 | Schwartz |
| 6,625,429 B1 | 9/2003 | Yamashita |
| 6,657,993 B1 | 12/2003 | Casanova et al. |
| 6,697,603 B1 | 2/2004 | Lovinggood et al. |
| 6,704,545 B1 | 3/2004 | Wala |
| 6,724,737 B1 | 4/2004 | Boyden et al. |
| 6,785,558 B1 | 8/2004 | Straford et al. |
| 6,801,767 B1 | 10/2004 | Schwartz et al. |
| 6,804,540 B1 | 10/2004 | Shepherd et al. |
| 6,826,164 B2 | 11/2004 | Mani et al. |
| 6,831,901 B2 | 12/2004 | Millar |
| 6,836,660 B1 | 12/2004 | Wala |
| 6,963,552 B2 | 11/2005 | Sabat, Jr. et al. |
| 7,102,442 B2 | 9/2006 | Anderson |
| 7,145,704 B1 | 12/2006 | Islam |
| 7,257,328 B2 | 8/2007 | Levinson et al. |
| 7,283,519 B2 | 10/2007 | Girard |
| 7,286,507 B1 | 10/2007 | Oh et al. |
| 7,339,891 B2 | 3/2008 | Binder et al. |
| 7,339,897 B2 | 3/2008 | Larsson et al. |
| 7,362,776 B2 | 4/2008 | Meier et al. |
| 7,489,632 B2 | 2/2009 | Lakkakorpi |
| 7,496,367 B1 | 2/2009 | Ozturk et al. |
| 7,603,141 B2 | 10/2009 | Dravida |
| 7,610,460 B2 | 10/2009 | Watanabe et al. |
| 7,634,536 B2 | 12/2009 | Halasz |
| 7,639,982 B2 | 12/2009 | Wala |
| 7,650,112 B2 | 1/2010 | Utsumi et al. |
| 7,765,294 B2 | 7/2010 | Edwards et al. |
| 7,787,854 B2 | 8/2010 | Conyers et al. |
| 7,801,038 B2 | 9/2010 | Liao et al. |
| 7,826,369 B2 | 11/2010 | Filsfils et al. |
| 7,848,747 B2 | 12/2010 | Wala |
| 7,848,770 B2 | 12/2010 | Scheinert |
| 7,855,977 B2 | 12/2010 | Morrison et al. |
| 8,010,099 B2 | 8/2011 | Ma et al. |
| 8,010,116 B2 | 8/2011 | Scheinert |
| 8,032,148 B2 | 10/2011 | Hettstedt et al. |
| 8,036,226 B1 | 10/2011 | Ma et al. |
| 8,098,572 B2 | 1/2012 | Zhou et al. |
| 8,112,094 B1 | 2/2012 | Wellington |
| 8,139,492 B1 | 3/2012 | Peterson et al. |
| 8,149,950 B2 | 4/2012 | Kim et al. |
| 8,213,401 B2 | 7/2012 | Fischer et al. |
| 8,274,332 B2 | 9/2012 | Cho et al. |
| 8,326,218 B2 | 12/2012 | Wala |
| 8,346,091 B2 | 1/2013 | Kummetz et al. |
| 8,346,160 B2 | 1/2013 | Kummetz |
| 8,351,877 B2 | 1/2013 | Kim et al. |
| 8,363,628 B2 | 1/2013 | Chi et al. |
| 8,369,272 B2 | 2/2013 | Barbaresi et al. |
| 8,446,530 B2 | 5/2013 | Bellers |
| 8,451,735 B2 | 5/2013 | Li |
| 8,478,331 B1 | 7/2013 | Rogers et al. |
| 8,520,603 B2 | 8/2013 | Kozisek et al. |
| 8,527,003 B2 | 9/2013 | Gupta et al. |
| 8,532,242 B2 | 9/2013 | Fischer et al. |
| 8,542,768 B2 | 9/2013 | Kim et al. |
| 8,548,526 B2 | 10/2013 | Schmidt et al. |
| 8,577,286 B2 | 11/2013 | Wala |
| 8,583,100 B2 | 11/2013 | Koziy et al. |
| 8,681,917 B2 | 3/2014 | McAllister et al. |
| 8,682,338 B2 | 3/2014 | Lemson et al. |
| 8,730,786 B2 | 5/2014 | Wang et al. |
| 8,737,454 B2 | 5/2014 | Wala et al. |
| 8,804,870 B2 | 8/2014 | Kim et al. |
| 8,811,917 B2 | 8/2014 | Kim et al. |
| 8,842,649 B2 | 9/2014 | Liu et al. |
| 8,855,489 B2 | 10/2014 | Boldi et al. |
| 8,958,789 B2 | 2/2015 | Bauman et al. |
| 9,026,067 B2 | 5/2015 | Stapleton et al. |
| 9,137,078 B2 | 9/2015 | Stapleton et al. |
| 9,148,324 B2 | 9/2015 | Stapleton et al. |
| 9,419,714 B2 | 8/2016 | Lemson et al. |
| 9,419,837 B2 | 8/2016 | Stapleton et al. |
| 9,531,473 B2 | 12/2016 | Lemson et al. |
| 9,820,171 B2 | 11/2017 | Lemson et al. |
| 10,045,314 B2 | 8/2018 | Stapleton et al. |
| 10,080,178 B2 | 9/2018 | Stapleton et al. |
| 10,159,074 B2 | 12/2018 | Lemson et al. |
| 10,334,499 B2 | 6/2019 | Stapleton et al. |
| 2001/0034223 A1 | 10/2001 | Rieser et al. |
| 2002/0075906 A1 | 6/2002 | Cole et al. |
| 2002/0086675 A1 | 7/2002 | Mansour |

(56) References Cited

U.S. PATENT DOCUMENTS

| | | | |
|---|---|---|---|
| 2002/0093926 A1* | 7/2002 | Kilfoyle | H04B 7/2606 370/335 |
| 2002/0186436 A1 | 12/2002 | Mani et al. | |
| 2002/0187809 A1 | 12/2002 | Mani et al. | |
| 2002/0191565 A1 | 12/2002 | Mani et al. | |
| 2003/0021263 A1 | 1/2003 | Lee | |
| 2003/0021278 A1 | 1/2003 | Domschitz et al. | |
| 2003/0143947 A1 | 7/2003 | Lyu | |
| 2003/0181221 A1* | 9/2003 | Nguyen | H04B 7/12 455/562.1 |
| 2004/0053624 A1 | 3/2004 | Frank et al. | |
| 2005/0143091 A1 | 6/2005 | Shapira et al. | |
| 2005/0152695 A1 | 7/2005 | Sulzberger et al. | |
| 2005/0157675 A1 | 7/2005 | Feder et al. | |
| 2005/0181812 A1 | 8/2005 | Scheck | |
| 2005/0206564 A1 | 9/2005 | Mao | |
| 2005/0220066 A1 | 10/2005 | Wal et al. | |
| 2006/0094470 A1 | 5/2006 | Wake et al. | |
| 2006/0121944 A1 | 6/2006 | Buscaglia et al. | |
| 2006/0233184 A1 | 10/2006 | Stanforth | |
| 2006/0270366 A1 | 11/2006 | Rozenblit et al. | |
| 2007/0019598 A1 | 1/2007 | Prehofer | |
| 2007/0058742 A1 | 3/2007 | Demarco et al. | |
| 2007/0064506 A1 | 3/2007 | Bauman et al. | |
| 2007/0065078 A1 | 3/2007 | Jiang | |
| 2007/0066234 A1 | 3/2007 | Lastinger et al. | |
| 2007/0116046 A1 | 5/2007 | Liu et al. | |
| 2007/0147488 A1 | 6/2007 | Han | |
| 2007/0177552 A1 | 8/2007 | Wu et al. | |
| 2007/0281643 A1 | 12/2007 | Kawai | |
| 2008/0045254 A1 | 2/2008 | Gupta et al. | |
| 2008/0051129 A1 | 2/2008 | Abe et al. | |
| 2008/0058018 A1 | 3/2008 | Scheinert | |
| 2008/0069032 A1 | 3/2008 | Liu | |
| 2008/0089689 A1 | 4/2008 | Sakama | |
| 2008/0107014 A1 | 5/2008 | Huang et al. | |
| 2008/0119198 A1 | 5/2008 | Hettstedt et al. | |
| 2008/0146146 A1 | 6/2008 | Binder et al. | |
| 2008/0225816 A1 | 9/2008 | Osterliing et al. | |
| 2008/0240036 A1 | 10/2008 | Liu et al. | |
| 2009/0003196 A1 | 1/2009 | Capece et al. | |
| 2009/0046586 A1 | 2/2009 | Stuart et al. | |
| 2009/0060088 A1 | 3/2009 | Callard et al. | |
| 2009/0060496 A1 | 3/2009 | Liu et al. | |
| 2009/0154621 A1 | 6/2009 | Shapira et al. | |
| 2009/0170543 A1 | 7/2009 | Mostafa et al. | |
| 2009/0180407 A1 | 7/2009 | Sabat et al. | |
| 2009/0180426 A1 | 7/2009 | Sabat et al. | |
| 2009/0180462 A1 | 7/2009 | Duerdodt et al. | |
| 2009/0191891 A1 | 7/2009 | Ma et al. | |
| 2009/0238566 A1 | 9/2009 | Boldi et al. | |
| 2009/0252136 A1 | 10/2009 | Mahany et al. | |
| 2009/0274048 A1 | 11/2009 | Sambhwani et al. | |
| 2009/0274085 A1 | 11/2009 | Wang et al. | |
| 2009/0286484 A1 | 11/2009 | Phung et al. | |
| 2010/0002661 A1 | 1/2010 | Schmidt et al. | |
| 2010/0087227 A1 | 4/2010 | Francos et al. | |
| 2010/0128676 A1 | 5/2010 | Wu et al. | |
| 2010/0130130 A1 | 5/2010 | Liu | |
| 2010/0136998 A1 | 6/2010 | Lott et al. | |
| 2010/0157901 A1 | 6/2010 | Sanderovitz et al. | |
| 2010/0177759 A1 | 7/2010 | Fischer et al. | |
| 2010/0177760 A1 | 7/2010 | Cannon et al. | |
| 2010/0178936 A1 | 7/2010 | Wala et al. | |
| 2010/0202565 A1 | 8/2010 | Abbasfar | |
| 2010/0210267 A1 | 8/2010 | Bae et al. | |
| 2010/0238904 A1 | 9/2010 | Zhang et al. | |
| 2010/0247105 A1 | 9/2010 | Yu | |
| 2010/0278530 A1 | 11/2010 | Kummetz et al. | |
| 2010/0279704 A1 | 11/2010 | Vachhani | |
| 2010/0291949 A1 | 11/2010 | Shapira et al. | |
| 2010/0296816 A1 | 11/2010 | Larson | |
| 2010/0299173 A1 | 11/2010 | Zampiello et al. | |
| 2010/0311372 A1 | 12/2010 | Bouyaud et al. | |
| 2011/0009056 A1 | 1/2011 | Hanson et al. | |
| 2011/0065438 A1* | 3/2011 | Bergman | H04W 36/06 455/436 |
| 2011/0069657 A1 | 3/2011 | Gholmieh et al. | |
| 2011/0103309 A1 | 5/2011 | Wang et al. | |
| 2011/0135013 A1 | 6/2011 | Wegener | |
| 2011/0135308 A1 | 6/2011 | Tarlazzi et al. | |
| 2011/0158116 A1* | 6/2011 | Tenny | H04W 56/0045 370/252 |
| 2011/0223958 A1 | 9/2011 | Chen et al. | |
| 2011/0237178 A1 | 9/2011 | Seki et al. | |
| 2011/0241425 A1 | 10/2011 | Hunter, Jr. et al. | |
| 2011/0249708 A1 | 10/2011 | Maca | |
| 2011/0281579 A1 | 11/2011 | Kummetz | |
| 2011/0287791 A1 | 11/2011 | Fujishima et al. | |
| 2011/0300870 A1 | 12/2011 | Chun et al. | |
| 2012/0002967 A1 | 1/2012 | Mayer et al. | |
| 2012/0057572 A1 | 3/2012 | Evans et al. | |
| 2012/0127938 A1 | 5/2012 | Lv et al. | |
| 2012/0281565 A1 | 11/2012 | Sauer | |
| 2013/0095870 A1 | 4/2013 | Phillips et al. | |
| 2014/0126914 A1 | 5/2014 | Berlin et al. | |
| 2017/0181008 A1 | 6/2017 | Fischer | |
| 2017/0214420 A1 | 7/2017 | Phillips et al. | |
| 2019/0208523 A1 | 7/2019 | Lemson et al. | |

FOREIGN PATENT DOCUMENTS

| | | |
|---|---|---|
| CN | 100341292 C | 10/2007 |
| CN | 100426897 C | 10/2008 |
| CN | 201127027 Y | 10/2008 |
| CN | 101394647 A | 3/2009 |
| CN | 101433124 A | 5/2009 |
| CN | 101453699 A | 6/2009 |
| CN | 101453799 A | 6/2009 |
| CN | 101521893 A | 9/2009 |
| CN | 101523969 A | 9/2009 |
| CN | 201307942 Y | 9/2009 |
| CN | 101621806 A | 1/2010 |
| CN | 101754229 A | 6/2010 |
| CN | 101754431 A | 6/2010 |
| CN | 103201958 A | 7/2013 |
| EP | 0368673 A1 | 5/1991 |
| EP | 0642243 A1 | 3/1995 |
| EP | 1227605 A2 | 7/2002 |
| EP | 1118234 B1 | 2/2006 |
| EP | 1713290 A1 | 10/2006 |
| EP | 1924109 A1 | 5/2008 |
| JP | H04-207532 A | 7/1992 |
| JP | H05-136724 A | 6/1993 |
| JP | 2002-158615 A1 | 5/2002 |
| JP | 2004-147009 A | 5/2004 |
| JP | 2007-006163 A | 1/2007 |
| JP | 2007-523577 A | 8/2007 |
| JP | 2007-235738 A | 9/2007 |
| JP | 2007-529926 A | 10/2007 |
| JP | 2008-506322 A | 2/2008 |
| JP | 2008-099137 A | 4/2008 |
| JP | 2008-516503 A | 5/2008 |
| JP | 2008-135955 A | 6/2008 |
| JP | 2009-296335 A | 12/2009 |
| JP | 2010-509816 A | 3/2010 |
| JP | 2010-166531 A | 7/2010 |
| JP | 2010-541297 A | 12/2010 |
| KR | 1996-7002978 | 5/1996 |
| KR | 10-2009-0088083 | 8/2009 |
| KR | 10-2010-0107065 A | 10/2010 |
| KR | 10-2014-0026321 | 3/2014 |
| WO | WO 94/28690 | 12/1994 |
| WO | WO 98/24256 | 6/1998 |
| WO | WO 00/23956 | 4/2000 |
| WO | WO 01/56197 | 8/2001 |
| WO | WO 02/23956 | 3/2002 |
| WO | WO 02/47414 | 6/2002 |
| WO | WO 02/056481 | 7/2002 |
| WO | WO 02/102102 | 12/2002 |
| WO | WO 2006/040653 | 4/2006 |
| WO | WO 2007/127543 | 11/2007 |
| WO | WO 2008/036976 | 3/2008 |
| WO | WO 2008/061701 | 5/2008 |

(56) References Cited

FOREIGN PATENT DOCUMENTS

| | | |
|---|---|---|
| WO | WO 2008/146394 | 12/2008 |
| WO | WO 2008/154077 | 12/2008 |
| WO | WO 2009/097237 | 8/2009 |
| WO | WO 2009/151893 | 12/2009 |
| WO | WO 2010/008794 | 1/2010 |
| WO | WO 2010/083115 | 7/2010 |
| WO | WO 2010/087031 | 8/2010 |
| WO | WO 2010/133942 | 11/2010 |
| WO | WO 2012/024343 | 2/2012 |
| WO | WO 2012/024345 | 2/2012 |
| WO | WO 2012/024349 | 2/2012 |

OTHER PUBLICATIONS

ADC Digivance "Street-Level Coverage Solution System with Version 3.01 EMS Software Operation and Maintenance Manual" ADCP-75-187; Issue 1; Sep. 2005 (78 pages).
ADC Digivance "CXD Multi-Band Distributed Antenna System Installation and Operation Manual" ADCP-75-192; Preliminary Issue D; Oct. 2005 (122 pages).
ADC Digivance "Street-Level Coverage Solution 800 MHz, 1900 MHz, and 800/900 MHz SMR System Operation and Maintenance Manual" ADCP-75-187; Preliminary Issue 1B; Nov. 2005 (88 pages).
ADC Digivance "CXD Multi-Band Distributed Antenna System Operation Manual" ADCP-75-192; Issue 1; Dec. 2005 (130 pages).
ADC Digivance "Indoor Coverage Solution 800 MHz Single- or Multi-Mode Fiber System Installation and Operation Manual" ADC-75-130; Preliminary Issue 3C; Aug. 2006 (78 pages).
ADC Digivance "NXS Radio Access Node (RAN) Installation and Maintenance Manual" ADCP-75-210; Issue 1; Nov. 2006 (84 pages).
ADC FlexWave Prism Element Management System 6.0 User Manual; ADCP-77-152; Issue 1; Mar. 2010 (308 pages).
ADC FlexWave Prism Element Management System 7.1 User Manual; ADCP-77-177; Issue 1; Jul. 2011 (350 pages).
ADC FlexWave Prism 6.0; Troubleshooting Guide; ADCP-77-074; Issue 1; Oct. 2010 (62 pages).
ADC FlexWave Prism Remote RF Module Installation Instructions; ADCP-77-079; Issue 2; Mar. 2010 (30 pages).
ADC FlexWave Prism Remote RF Module Installation Instructions; ADCP-77-079; Issue 3; Jul. 2011 (32 pages).
ADC FlexWave Prism Remote 40W RF Module Installation Instructions; ADCP-77-162; Issue 1; Mar. 2010 (26 pages).
ADC FlexWave Prism Remote Unit Installation Guide; ADCP-77-072; Issue 4; Jul. 2011 (44 pages).
ADC FlexWave Prism Remote Unit Installation Guide; ADCP-77-072; Issue 5; Nov. 2011 (44 pages).
ADC FlexWave Prism "Flexible Outdoor Wireless Coverage Capacity" 106969AE; Oct. 2008 (8 pages).
ADC FlexWave Prism Host, Remote and EMS 5.1 "System Reference" ADCP-77-073; Issue 2; Nov. 2009 (364 pages).
ADC FlexWave URH Operation and Maintenance Manual—Preliminary; 2007 (7 pages).
ADC FlexWave Universal Radio Head (URH) Radio Head (URH) Host Unit "Installation Instructions" ADCP-75-347; Issue 1; Apr. 2008 (32 pages).
ADC FlexWave Universal Radio Head (URH) Radio Head (URH) Host Unit "Installation Instructions" ADCP-75-348; Issue 1; Apr. 2008 (44 pages).
ADC FlexWave User Manual "FlexWave Web-Based Element Management System; EMS for Universal Radio Head System" ADCP-75-352; Aug. 2008 (160 pages).
Das, Sajal K. et al. "A Dynamic Load balancing Strategy for Channel Assignment Using Selective Borrowing in Cellular Mobile Environment" Wireless Networks 3; 1997; 15 pages.
ETSI TS 125 101 V.3.11,0 "Universal Mobile Telecommunications System (UMTS); UE Radio Transmission and Reception (FDD) (3GPP TS 25.101 Version 3.11.0 Release 1999" Jun. 2002 (69 pages).

ETSI TS 125 423 V5.6.0 "Universal Mobile Telecommunications System (UMTS); UTRAN Iur Interface Radio Network Subsystem Application Part (RNSAP) Signaling (3GPP TS 25.423 version 5.6,0 Release 5)" Jun. 2003 (559 pages).
Hollis, T. et al. "The Theory of Digital Down Conversion" Hunt Engineering; Jun. 26, 2003 (6 pages).
Information Sciences Institute, University of Southern California "DOD Standard Internet Protocol" RFC 760; Jan. 1980 (46 pages).
Information Sciences Institute, University of Southern California "Internet Protocol; DARPA Internet Program; Protocol Specification" RFC 791; Sep. 1981 (49 pages).
OBSAI "Open Base Station Architecture Initiative: BTS System Reference Document" Version 2.0; Apr. 27, 2006 (151 pages).
OBSAI "Open Base Station Architecture Initiative: Reference Point 3 Specification" Version 3.1; Nov. 13, 2006 (116 pages).
OBSAI "Open Base Station Architecture Initiative: Reference Point 3 Specification" Version 4.1; Jul. 14, 2008 (144 pages).
Notice of Allowance for U.S. Appl. No. 16/868,748, dated Jun. 18, 2020.
Documents filed with U.S. District Court Proceedings for *Dali Wireless, Inc.* v. *Commscope Technologies, LLC et al.*; U.S. District Court, for the District of Delaware; Civil Action No. 1:19-cv-00952-MN; Includes documents filed Jun. 17, 2020; Docket No. 50; (1 page).
Defendant CommScope's Initial Invalidity Contentions for *Dali Wireless, Inc.* v. *Commscope Technologies, LLC et al.*; U.S. District Court, for the District of Delaware; Civil Action No. 1:19-cv-00952-MN; filed Jul. 2, 2020 (10 pages).
Documents filed with U.S. District Court Proceedings for *Dali Wireless, Inc.* v. *Corning Optical Communications LLC*; U.S. District Court, for the Western District of North Carolina; Civil Action No. 3:19-cv-00714; Includes documents filed on Jun. 15, 2020; Docket Nos. 22-23; (124 pages).
Documents filed with U.S. District Court Proceedings for *Dali Wireless, Inc.* v. *Corning Optical Communications LLC*; U.S. District Court, for the Western District of North Carolina; Civil Action No. 3:19-cv-00714; Includes documents filed from Jun. 29, 2020-Jul. 6, 2020; Docket Nos. 24-25; (149 pages).
Documents filed with U.S. Court of Appeals for the Federal Circuit for *Dali Wireless Inc.* v *Commscope Technologies LLC*; Appeal Docket No. 2020-1045; Includes documents filed on Jun. 22, 2020; Docket No. 26; (1 page).
Notification of Grant of Patent for Invention (Including Translation) for Chinese Application No. 201611139142.1, dated Apr. 29, 2020.
Second Office Action (Including Translation) for Chinese Application No. 201611139152.5, dated Jun. 9, 2020.
Final Notice of Reasons for Rejection (Including Translation) for Japanese Application No. 2019-000096, dated Jun. 16, 2020.
Office Action for European Application No. 11818695.6, dated Jun. 17, 2020.
U.S. Appl. No. 16/737,419, filed Jan. 8, 2020, Lemson et al.
U.S. Appl. No. 60/877,035, filed Dec. 26, 2006, Kim et al.
U.S. Appl. No. 60/925,603, filed Apr. 23, 2007, Kim et al.
U.S. Appl. No. 60/925,577, filed Apr. 23, 2007, Cho et al.
U.S. Appl. No. 61/012,416, filed Dec. 8, 2007, Kim et al.
U.S. Appl. No. 61/041,164, filed Mar. 31, 2008, Kim et al.
U.S. Appl. No. 61/172,642, filed Apr. 24, 2009, Stapleton et al.
U.S. Appl. No. 61/288,838, filed Dec. 21, 2009, Kim et al.
U.S. Appl. No. 61/288,840, filed Dec. 21, 2009, Wang et al.
U.S. Appl. No. 61/288,844, filed Dec. 21, 2009, Kim et al.
U.S. Appl. No. 61/288,847, filed Dec. 21, 2009, Kim et al.
U.S. Appl. No. 61/374,593, filed Aug. 17, 2010, Lemson et al.
U.S. Appl. No. 61/382,836, filed Sep. 24, 2010, Lemson et al.
U.S. Appl. No. 61/439,940, filed Feb. 7, 2011, Stapleton et al.
BICSI "Network Design Basics for Cabling Professionals" McGraw-Hill; 2002; 393 pages.
Brunner, Christopher et al "On-Space-Time Rake Receiver Structures for WCDMA" IEEE 1999; pp. 1546-1551.
Cheun, Kyungwhoon "Performance of Direct-Sequence Spread-Spectrum RAKE Receivers with Random Spreading Sequences" IEEE Transactions on Communications; vol. 45, No. 9; Sep. 1997; 14 pages.

(56) References Cited

OTHER PUBLICATIONS

CityCell 824 "Remote Site Manual, How to Use It, Preliminary Version" Feb. 1, 1993; 237 pages.
CPRI Specification V2.1 "Common Public Radio Interface (CPRI); Interface Specification" Mar. 31, 2006; 76 pages.
CPRI Specification V3.0 "Common Public Radio Interface (CPRI); Interface Specification" Oct. 20, 2006; 89 pages.
CPRI Specification V4.0 "Common Public Radio Interface (CPRI); Interface Specification" Jun. 30, 2008; 96 pages.
CPRI Specification V4,1 "Common Public Radio Interface (CPRI); Interface Specification" Mar. 31, 2006; 64 pages.
CPRI Specification V4.1 "Common Public Radio Interface (CPRI); Interface Specification" Feb. 18, 2009; 109 pages.
Crofut, Walter "Remote Monitoring of Wireless Base Stations" Available at http://urgentcomm.com/print/mag/remote-monitoring-wireless-base-stations; Jun. 1, 1998.
Cyr, Russell J. et al "The Digital Age is Here: Digital Radio Frequency Transport Enhances Cellular Network Performance" Telephony; Jul. 15, 1993; 5 pages.
Grace, Martin K. "Synchronous Quantized Subcarrier Multiplexing for Transport of Video, Voice, and Data" IEEE Journal on Selected Areas in Communications; vol. 8, No. 7; Sep. 1999; 8 pages.
Graf, Rudolf F. "Modern Dictionary of Electronics; 7th Edition" Newnes Publishing; 1999; 9 pages).
Grundmann, Lorne R. et al "An Empirical Comparison of a Distributed Antenna Microcell System Versus a Single Antenna Microcell System for Indoor Spread Spectrum Communications at 1.8 GHz" IEEE; 1993; pp. 59-63.
Horak, Ray "Telecommunications and Data Communications Handbook" Wiley-Interscience A John Wiley & Sons, Inc., Publication, 2007; 55 pages.
"Introduction to Receivers" Available at http://weww.ece.ucsb.edu/~long/ece145a/Introduction_to_Receivers.pdf downloaded Jun. 15, 2017; 28 pages.
Kaplan, Steven M. "Wiley Electrical and Electronics Engineering Dictionary" IEEE Press, Wiley-Interscience; A John Wiley & Sons, Inc, Publication; 2004; 7 pages.
Lan, Lina et al. "GSM Co-Channel and Adjacent Channel Interference Analysis and Optimization" Tsinghus Science and Technology; vol. 16, No. 6; Dec. 2011; 6 pages.
Laplante, Phillip A. "Comprehensive Dictionary of Electrical Engineering" IEEE Press; CRC Press LLC, 1999; 4 pages.
"Mastering the Mix in Signal Processing; Mixed-Signal Design Seminar" Analog Devices, Inc.; 1991; 3 pages.
Microsoft Press "Computer Dictionary: The Comprehensive Standard for Business, School, Library, and Home" 1991; 6 pages.
Parker, Sybil P. "McGraw-Hill Dictionary of Science and Technical Terms: 5th Edition" McGraw-Hill, Inc. 1994; 6 pages.
Pereira, Stephen M. "Standardizing Digital IF Data Transfer with VITA 49" RTC Magazine; Jan. 2006.
Spurgeon, Charles E. "Ethernet: The Definitive Guide" O'Reilly; Feb. 2000; 112 pages.
Wala, Philip M. "A New Microcell Architecture Using Digital Optical Transport" IEEE 1993; pp. 585-588.
Zhaohui, Zheng et al. "A RAKE Type Receiver Struture for CDMA Mobile Communication Systems Using Antenna Arrays" IEEE 1996; pp. 528-530.
International Search Report for International Application No. PCT/US2011/048004, dated Jan. 5, 2012.
Written Opinion Report for International Application No. PCT/US2011/048004, dated Jan. 5, 2012.
International Preliminary Report on Patentability for International Application No. PCT/US2011/048004, dated Sep. 13, 2012.
Office Action (Including Translation) for Chinese Application No. 201180050066.6, dated Aug. 4, 2014.
Office Action (Including Translation) for Chinese Application No. 201180050066.6, dated Apr. 13, 2015.
Office Action for Chinese Application No. 201180050066.6, dated Jan. 4, 2016.
Notification to Grant Patent Right for Invention (Including Translation) for Chinese Application No. 201180050066.6, dated Sep. 27, 2016.
Office Action for Chinese Application No. 201610011597.9, dated Mar. 29, 2018.
Notification to Grant Patent Right for Invention (Including Translation) for Chinese Application No. 201610011597.9, dated Feb. 20, 2019.
Office Action (Including Translation) for Chinese Application No. 201611139142.1, dated Aug. 2, 2019.
Office Action (Including Translation) for Chinese Application No. 201611138820.2 dated Sep. 3, 2019.
Office Action (Including Translation) for Chinese Application No. 201611138760.4, dated Aug. 16, 2019.
Notification of Grant of Patent for Invention (Including Translation) for Chinese Application No. 201611138760.4, dated Mar. 17, 2020.
Office Action (Including Translation) for Chinese Application No. 201611139152.5, dated Aug. 2, 2019.
European Search Report for European Application No. 11818697.2, dated Aug. 21, 2017.
Office Action for European Application No. 11818697.2, dated Jan. 17, 2019.
Office Action for European Application No. 11818697.2, dated Mar. 13, 2020.
Substantive Examination Report (Including Translation) for Indonesian Application No. W00201300670, dated Jan. 6, 2017.
Substantive Examination Report (Including Translation) for Indonesian Application No. W00201300670, dated Dec. 19, 2017.
Notice of Allowance (Including Translation) for Indonesian Application No. W00201300670, dated Oct. 23, 2019.
Office Action for Indonesian Application No. P00201703225, dated Feb. 24, 2020.
Examination Report for Indian Application No. 1856/CHENP/2013, dated Oct. 26, 2018.
Notice of Reasons for Refusal (includes a machine translation) for Japanese Patent Application No. 2013-525983, dated May 19, 2015.
Notice of Reasons for Refusal (includes a machine translation) for Japanese Patent Application No. 2013-525983, dated Jan. 19, 2016.
Decision to Grant a Patent (includes a machine translation) for Japanese Patent Application No. 2013-525983, dated Aug. 9, 2016.
Office Action (including translation) for Japanese Patent Application No. 2016-139702, dated Apr. 20, 2017.
Office Action (including translation) for Japanese Patent Application No. 2016-139702, dated Jan. 12, 2018.
Decision to Grant a Patent (including translation) for Japanese Patent Application No. 2016-139702, dated Aug. 17, 2018.
Office Action (Including Translation) for Japanese Patent Application No. 2016-174930, dated Aug. 4, 2017.
Office Action (Including Translation) for Japanese Patent Application No. 2016-174930, dated Mar. 20, 2018.
Decision to Grant (Including Translation) for Japanese Patent Application No. 2016-174930, dated Dec. 3, 2018.
Office Action (Including Translation) for Japanese Application No. 2019-000096, dated Jul. 22, 2019.
Notification of Reasons for Refusal (Including Translation) for Korean Application No. 10-2013-7006775, dated May 22, 2017.
Grant of Patent (Including Translation) for Korean Application No. 10-2013-7006775, dated Mar. 29, 2018.
Grant of Patent (Including Translation) for Korean Application No. 10-2018-7018518, dated Nov. 5, 2018.
Notification if Reason for Refusal (Including Translation) for Korean Application No. 10-2019-7003593, dated May 20, 2019.
Notice of Allowance (Including Translation) for Korean Application No. 10-2019-7003593, dated Mar. 5, 2020.
International Search Report for International Application No. PCT/US2011/047995, dated Dec. 22, 2011.
Written Opinion for International Application No. PCT/US2011/047995, dated Dec. 22. 2011.
International Search Report of International Application No. PCT/US2011/047999, dated Dec. 19, 2011.
Written Opinion of International Application No. PCT/US2011/047999, dated Dec. 19, 2011.

(56) References Cited

OTHER PUBLICATIONS

International Preliminary Report on Patentability of International Application No. PCT/US2011/047999, dated Apr. 18, 2013.
First Office Action (Including Translation) for Chinese Application No. 201180050052.4, dated Aug. 29, 2014.
Notification to Grant Patent Right for Invention (Including Translation) for Chinese Application No. 201180050052.4, dated Jun. 11, 2015.
First Office Action (Including Translation) for Chinese Application No. 201510502030.7, dated Jan. 2, 2018.
Notification to Grant Patent Right for Invention (Including Translation) for Chinese Application No. 201510502030.7, dated Jul. 6, 2018.
First Office Action (Including Translation) for Chinese Application No. 201510531485.1, dated Nov. 2, 2017.
Notification to Grant Patent Right for Invention (Including Translation) for Chinese Application No. 201510531485.1, dated Sep. 4, 2018.
Partial European Search Report for European Application No. 11818695.6, dated Aug. 31, 2017.
European Search Report for European Application No. 11818695.6, dated Dec. 1, 2017.
Office Action for European Application No. 11818695.6, dated Mar. 20, 2019.
Office Action for European Application No. 11818695.6, dated Apr. 22, 2020.
Substantive Examination Report (Including Translation) for Indonesian Application No. W00201300983, dated Jun. 18, 2019.
Notification of Grant (Including Translation) for Indonesian Application No. W00201300983, dated Feb. 24, 2020.
Examination Report for Indian Application No. 1763/CHENP/2013, dated Aug. 28, 2018.
Notice of Reasons for Refusal (including translation) for Japanese Patent Application No. 2013-524942, dated Jul. 7, 2015.
Decision to Grant (including translation) for Japanese Patent Application No. 2013-524942, dated Nov. 17, 2015.
Notice of Reasons for Refusal (including translation) for Japanese Patent Application No. 2015-245373, dated Sep. 13, 2016.
Decision to Grant (including translation) for Japanese Patent Application No. 2015-245373, dated Apr. 11, 2017.
Decision to Grant (Including Translation) for Japanese Patent Application No. 2017-094314, dated Jun. 1, 2018.
Notice of Reasons for Refusal (Including Translation) for Japanese Patent Application No. 2018-124665, dated Jul. 22, 2019.
Decision to Grant a Patent (Including Translation) for Japanese Patent Application No. 2018-124665, dated Feb. 12, 2020.
Notification of Reason for Refusal (Including Translation) for Korean Application No. 10-2013-7006776, dated Jun. 12, 2015.
Decision to Grant a Patent (Including Translation) for Korean Application No. 10-2013-7006776, dated Jan. 20, 2016.
Notification of Reason for Refusal (Including Translation) for Korean Application No. 10-2015-7024302, dated Dec. 2, 2015.
Notification of Reason for Refusal (Including Translation) for Korean Application No. 10-2015-7024302, dated Oct. 5. 2016.
Notice of Final Rejection (Including Translation) for Korean Application No. 10-2015-7024302, dated Aug. 2, 2017.
Notice of Allowance (Including Translation) for Korean Application No. 10-2015-7024302, dated Nov. 10, 2017.
Notification of Reason for Refusal (Including Translation) for Korean Application No. 10-2018-7003797, dated Jun. 18, 2018.
Notification of Reason for Refusal (Including Translation) for Korean Application No. 10-2018-7003797, dated Apr. 29, 2019.
Notice of Allowance (Including Translation) for Korean Application No. 10-2018-7003797, dated Apr. 20, 2020.
Office Action for U.S. Appl. No. 13/211,247, dated Oct. 10, 2012.
Notice of Allowance for U.S. Appl. No. 13/211,247, dated Mar. 13, 2013.
Office Action for U.S. Appl. No. 13/211,247, dated Jul. 22, 2013.
Office Action for U.S. Appl. No. 13/211,247, dated Nov. 26, 2013.
Notice of Allowance for U.S. Appl. No. 13/211,247, dated Mar. 11, 2014.
Office Action for U.S. Appl. No. 13/913,207, dated Nov. 20, 2014.
Office Action for U.S. Appl. No. 13/913,207, dated Apr. 15, 2015.
Notice of Allowance for U.S. Appl. No. 13/913,207, dated May 26, 2015.
Office Action for U.S. Appl. No. 14/260,145, dated Jan. 27, 2015.
Notice of Allowance for U.S. Appl. No. 14/260,145, dated May 8, 2015.
Notice of Allowance for U.S. Appl. No. 14/260,145, dated Jun. 17, 2015.
First Action Interview Pilot Program Pre-Interview Communication for U.S. Appl. No. 14/800,515, dated Feb. 25, 2016.
Notice of Allowance for U.S. Appl. No. 14/800,515, dated May 20, 2016.
Office Action for U.S. Appl. No. 15/223,819, dated Jun. 5, 2017.
Office Action for U.S. Appl. No. 15/223,819, dated Sep. 29, 2017.
Advisory Action for U.S. Appl. No. 15/223,819, dated Dec. 11, 2017.
Notice of Allowance for U.S. Appl. No. 15/223,819, dated Feb. 1, 2018.
Notice of Allowance for U.S. Appl. No. 15/223,819, dated Jun. 5, 2018.
Office Action for U.S. Appl. No. 16/059,434, dated Feb. 21, 2019.
Notice of Allowance for U.S. Appl. No. 16/059,434, dated May 8, 2019.
Office Action (Restriction Requirement) for U.S. Appl. No. 13/211,243, dated Apr. 18, 2013.
Office Action for U.S. Appl. No. 13/211,243, dated May 30, 2013.
Notice of Allowance for U.S. Appl. No. 13/211,243, dated Nov. 8, 2013.
Office Action (Restriction Requirement) for U.S. Appl. No. 14/169,719 dated Jun. 15, 2015.
Office Action for U.S. Appl. No. 14/169,719 dated Sep. 10, 2015.
Notice of Allowance for U.S. Appl. No. 14/169,719 dated Apr. 13, 2016.
Office Action for U.S. Appl. No. 15/205,820, dated Dec. 13, 2016.
Notice of Allowance for U.S. Appl. No. 15/205,820, dated Mar. 22, 2017.
Notice of Allowance for U.S. Appl. No. 15/205,820, dated May 26, 2017.
Office Action for U.S. Appl. No. 14/949,405, dated Feb. 26, 2016.
Office Action for U.S. Appl. No. 14/949,405, dated Aug. 3, 2016.
Notice of Allowance for U.S. Appl. No. 14/949,405, dated Nov. 4, 2016.
Office Action for U.S. Appl. No. 15/391,408, dated Sep. 29, 2017.
Notice of Allowance for U.S. Appl. No. 15/391,408, dated Apr. 11, 2018.
Notice of Allowance for U.S. Appl. No. 15/391,408, dated Jul. 26, 2018.
Office Action for U.S. Appl. No. 16/175,520, dated Jul. 9, 2019.
Notice of Allowance for U.S. Appl. No. 16/175,520, dated Jan. 28, 2020.
Office Action for U.S. Appl. No. 16/737,419, dated Apr. 8, 2020.
Documents filed with U.S. District Court Proceedings for *Dali Wireless, Inc.* v. *Commscope Technologies, LLC et al.*; U.S. District Court, for the District of Delaware; Civil Action No. 1:19-cv-00952-MN; Includes documents filed from May 22, 2019-Feb. 27, 2020; Docket Nos. 1-34; (396 pages).
Documents filed with U.S. District Court Proceedings for *Dali Wireless, Inc.* v. *Commscope Technologies. LLC et al.*; U.S. District Court, for the District of Delaware; Civil Action No. 1:19-cv-00952-MN; Includes documents filed on Apr. 8, 2020; Docket Nos. 35-36; (12 pages).
Documents filed with U.S. District Court Proceedings for *Dali Wireless, Inc.* v. *John Mezzalingua Associates, LLC*; U.S. District Court, for the District of Delaware; Civil Action No. 1:19-cv-002367; Includes documents filed from Dec. 30, 2019-Apr. 17, 2020; Docket Nos. 1-21; (159 pages).
Documents filed with U.S. District Court Proceedings for *Dali Wireless, Inc.* v. *Corning Optical Communications LLC*; U.S. District Court, for the Western District of North Carolina; Civil Action

(56) References Cited

OTHER PUBLICATIONS

No. 3:19-cv-00714; Includes documents filed from Dec. 30, 2019-Jan. 8, 2020; Docket Nos. 1-6; (87 pages).
Documents filed with U.S. Court of Appeals for the Federal Circuit for *Dali Wireless Inc. v Commscope Technologies LLC*; Appeal Docket No. 2020-1045; Includes documents filed from Oct. 16, 2019-Apr. 6, 2020; Docket Nos. 1-24; (141 pages).
Petition for Inter Partes Review of U.S. Pat. No. 9,531,473, including Exhibits Case No. IPR2018-00571, filed Feb. 2, 2018 (1,967 pages).
Documents filed with *Commscope Technologies LLC v. Dali Wireless Inc.* United States Patent and Trademark Office—Before the Patent Trial and Appeal Board, Case No. IPR 2018-00571; Filed between Feb. 16, 2018-Nov. 27, 2019 (1,155 pages).
Final Written Decision for *Commscope Technologies LLC v. Dali Wireless Inc.* United States Patent and Trademark Office—Before the Patent Trial and Appeal Board, Case No. IPR 2018-00571: Filed Aug. 12, 2019 (39 pages).
U.S. Appl. No. 16/868,748, filed May 7, 2020, Lemson et al.
Office Action for U.S. Appl. No. 16/868,748, dated May 28, 2020.
Documents filed with U.S. District Court Proceedings for *Dali Wireless, Inc. v. Commscope Technologies, LLC et al.*; U.S. District Court, for the District of Delaware; Civil Action No. 1:19-cv-00952-MN; Includes documents publicly available on Apr. 8, 2020; Docket No. 24; (12 pages).
Documents filed with U.S. District Court Proceedings for *Dali Wireless, Inc. v. Commscope Technologies, LLC et al.*; U.S. District Court, for the District of Delaware; Civil Action No. 1:19-cv-00952-MN; Includes documents filed from May 21, 2020-Jun. 11, 2020; Docket Nos. 37-49; (376 pages).
Documents filed with U.S. District Court Proceedings for *Dali Wireless, Inc. v. John Mezzalingua Associates, LLC*; U.S. District Court, for the District of Delaware; Civil Action No. 1:19-cv-002367; Includes documents filed from Apr. 27, 2020-Jun. 12, 2020; Docket Nos. 22-27; (56 pages).
Documents filed with U.S. District Court Proceedings for *Dali Wireless, Inc. v. Corning Optical Communications LLC*; U.S. District Court, for the Western District of North Carolina; Civil Action No. 3:19-cv-00714; Includes documents filed from Apr. 30, 2020-May 27, 2020; Docket Nos. 7-21; (265 pages).
Documents filed with U.S. Court of Appeals for the Federal Circuit for *Dali Wireless Inc. v Commscope Technologies LLC*; Appeal Docket No. 2020-1045; Includes documents filed Apr. 29, 2020; Docket No. 25; (2 pages).
Office Action for U.S. Appl. No. 16/737,419, dated Jul. 27, 2020.
Notification of Reason for Refusal (Including Translation) for Korean Application No. 10-2020-7015717, dated Jul. 24, 2020.

* cited by examiner

DISTRIBUTED ANTENNA SYSTEM

CROSS-REFERENCES TO RELATED APPLICATIONS

The present application a continuation of Ser. No. 16/059,434, filed Aug. 9, 2018; which is a continuation of U.S. patent application Ser. No. 15/223,819, filed Jul. 29, 2016, now U.S. Pat. No. 10,080,178; which is a continuation of U.S. patent application Ser. No. 14/800,515, filed Jul. 15, 2015, now U.S. Pat. No. 9,419,837; which is a continuation of U.S. patent application Ser. No. 14/260,145, filed Apr. 23, 2014, now U.S. Pat. No. 9,137,078; which is a continuation of U.S. patent application Ser. No. 13/211,247, filed Aug. 16, 2011, now U.S. Pat. No. 8,737,300; which claims the benefit of U.S. Provisional Patent Application No. 61/439,940, filed Feb. 7, 2011, the disclosures of which are hereby incorporated by reference for all purposes.

FIELD OF THE INVENTION

The present invention generally relates to wireless communication systems employing Distributed Antenna Systems (DAS) as part of a distributed wireless network. More specifically, the present invention relates to a DAS utilizing one or more remotely monitored and controlled digital access units configured to assign particular packet transmissions to selected ones of a plurality of remote units, which can in some embodiments be configured in a daisy-chained rings.

BACKGROUND OF THE INVENTION

Wireless and mobile network operators face the continuing challenge of building networks that effectively manage high data-traffic growth rates. Mobility and an increased level of multimedia content for end users requires end-to-end network adaptations that support both new services and the increased demand for broadband and flat-rate Internet access. One of the most difficult challenges faced by network operators is maximizing the capacity of their DAS networks while ensuring cost-effective DAS deployments and at the same time providing a very high degree of DAS remote unit availability.

In order to provide DAS network capacity which is high enough to meet short-term needs of network subscribers in specific locations yet also avoid costly and inefficient deployment of radio resources, DAS network planners prefer to employ DAS architectures and solutions which provide a high degree of dynamic flexibility. Therefore, it would be advantageous for wireless network operators to employ a DAS solution which has a high degree of flexibility to implement dynamic rearrangements based on ever-changing network conditions and subscriber needs. Also, the more future-proof a DAS deployment can be, generally the lower its life cycle cost.

DAS network planners and system integrators employ a wide range of innovative approaches for helping to ensure that a particular DAS deployment is as cost-effective as possible. The types of costs considered by network planners and integrators include DAS deployment or DAS installation cost, as well as operational costs including maintenance costs, emergency restoration costs and network re-arrangement costs. Rearrangement costs are particularly significant for indoor DAS applications, due to frequent changes in building use and facility needs changes. Therefore, it would be advantageous to employ DAS systems and methods which are based on as few DAS transport facilities as possible to minimize installation and/or lease costs and have self-healing capabilities to avoid the need for costly emergency restoration services.

In order to obtain a high degree of DAS remote unit availability, two primary conditions must be satisfied. First, the DAS remote unit itself must be inherently reliable. Second, the transport media e.g., optical fiber, must be very reliable. It is well known that electronic and/or optical connections themselves are a significant root cause of failure or reduced availability in a DAS network. Companies who maintain outdoor DAS networks have reported that a failure of outside plant optical fiber facilities is not as rare as would be desirable. Therefore, it would be advantageous to employ systems and methods which offer higher redundancy and/or self-healing features in the event of failure of a transport media connection.

SUMMARY OF THE INVENTION

The present invention substantially achieves the advantages and benefits discussed above and overcomes the limitations of the prior art discussed above by providing a distributed antenna system responsive to one or more base stations and having at least one but in some embodiments a plurality of Digital Access Units ("DAU's"), each operating to control the packet traffic of an associated plurality of Digital Remote Units ("DRU's"). In embodiments employing multiple DAU's, the DAU's can be daisy-chained linearly or in a ring configuration. Likewise, depending upon the implementation, the DRU's associated with a given DAU can be configured in either a linear or ring Daisy chain configuration.

The data received from the base stations is down-converted, digitized and converted to baseband with the DAU. The data streams are then I/Q mapped and framed and independently serialized, such that multiple data streams are available in parallel from the DAU. In at least some embodiments, the DAU communicates with the associated DRU's via an optical transport arrangement. It will be appreciated by those skilled in the art that, using the present invention, it is possible to configure a distributed antenna system having n base stations, each providing m RF outputs for transmission by one or more associated DAU's to o DRU's, where the only limits are imposed by the technical performance specifications of the particular DAS, such as delay.

By the use of a ring configuration for connecting, in at least some embodiments, the DRU's and/or the DAU's, fault tolerance is built into the system, with resulting high availability. In single DAU embodiments, each DRU is accessible through two paths, and therefore remains available even in the event of a line break. In multi-DAU embodiments, where the DAU's are linearly daisy-chained, each DRU is accessible from multiple DRU's such that even some DAU failures will not prevent system operation. In embodiments employing a ring connection for the DAU's, multiple paths exist to each DAU, and thus provide an additional level of fault tolerance as well as dynamic load balancing and resource management as discussed in greater detail hereinafter.

Thus, the configuration of the advanced system architecture of the present invention provides a high degree of flexibility to manage, control, enhance and facilitate the radio resource efficiency, usage, availability, and overall performance of the distributed wireless network. The present invention enables specialized applications and enhancements including Flexible Simulcast, automatic traffic load-balancing, network and radio resource optimization, network calibration, autonomous/assisted commissioning, carrier pooling, automatic frequency selection, radio frequency carrier placement, traffic monitoring, traffic tagging, and indoor location determination using pilot beacons. The present invention can also serve multiple operators, multimode radios (modulation-independent) and multi-frequency bands per operator to increase the efficiency and traffic capacity of the operators' wireless networks.

Further the present invention provides a high degree of dynamic flexibility, supports dynamic re-arrangements, and provides a low life cycle cost. This advanced system architecture enables deployment of DAS networks using fewer DAS transport facilities to reduce costs, while providing self-healing features. The present invention also offers redundancy and enhanced system availability.

It is an object of the present invention to provide Flexible Simulcast capabilities, as disclosed in U.S. Provisional Application Ser. No. 61/382,836, entitled "Remotely Reconfigurable Distributed Antenna System and Methods," filed Sep. 14, 2010, incorporated herein by reference, in a high-availability ring configuration using, for example, optical fiber transport. As discussed above, the ring configuration insures that a break in any optical fiber cable will not shut down the daisy-chained network, because the downlink and uplink signals can be rerouted around the cable break to the respective DRUs.

It is a further object of the present invention to balance the bidirectional data rate on the optical fibers so as to increase the maximum achievable data rate during operation on the ring network of DRUs.

It is a further object of the present invention to provide higher transport network capacity in the event the data transport is asymmetrical between the downlink and uplink, as is typically the case for mobile broadband networks.

It is a further object of the present invention to provide an adaptive and automatic control for optimizing the transport media capacity on the ring.

It is a further object of the present invention to provide a method of summing co-channel users' uplink signals in the DRU daisy chain.

Applications of the present invention are suitable to be employed with distributed base stations, distributed antenna systems, distributed repeaters, mobile equipment and wireless terminals, portable wireless devices, and other wireless communication systems such as microwave and satellite communications. The present invention is also field upgradable through a link such as an Ethernet connection to a remote computing center.

Appendix I is a glossary of terms used herein, including acronyms.

BRIEF DESCRIPTION OF THE DRAWINGS

Further objects and advantages of the present invention can be more fully understood from the following detailed description taken in conjunction with the accompanying drawings in which:

FIG. 4 provides an example of a daisy chain ring network.

DETAILED DESCRIPTION OF THE INVENTION

Figure 1:
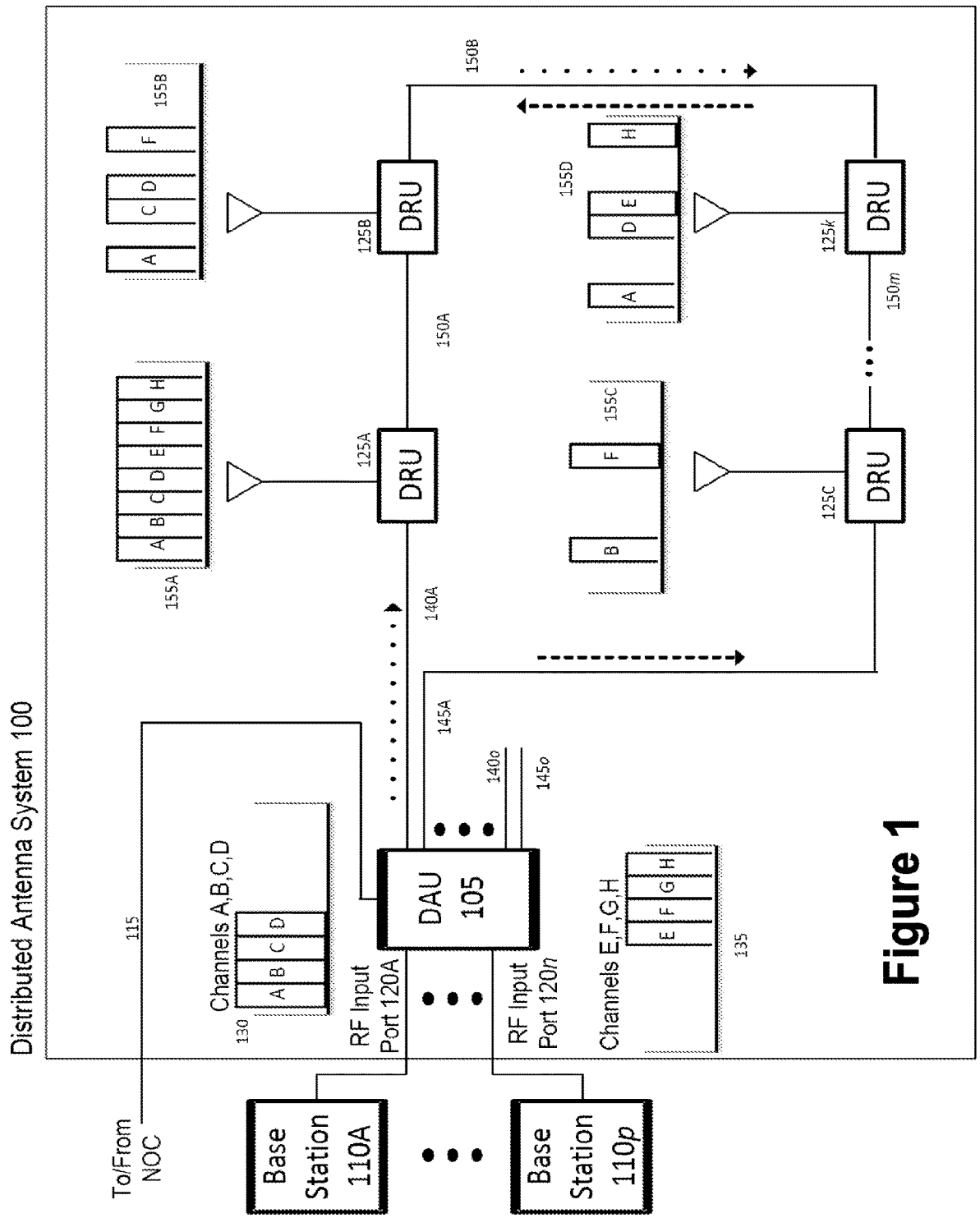
FIG. 1 is a block diagram according to one embodiment of the invention showing the basic structure and an example of a unidirectional, channelized downlink transport, one ring scenario based on having one DAU and four DRUs.

The present invention is a novel Reconfigurable Distributed Antenna System that provides a high degree of flexibility to manage, control, re-configure, enhance and facilitate the radio resource efficiency, usage and overall performance of the distributed wireless network. FIG. 1 illustrates an embodiment of the Distributed Antenna System 100 that provides an example of a unidirectional, channelized downlink transport in accordance with the present invention. In FIGS. 1-4, a dotted line denotes a distinct subset of uplink and downlink channels identified as "A." A dashed line denotes a distinct subset of uplink and downlink channels identified as "B." The subset of uplink and downlink channels in A do not include those of B and vice versa. The system employs a Digital Access Unit functionality 105 (hereinafter "DAU"). The DAU 105 serves as an interface between associated base stations (BTS) 110A-B and a plurality of digital remote units (DRU) 125A-n, although only four DRU's are shown in FIG. 1. In the present description, "DRU" will be used interchangeably with Remote Radio Head Unit, or "RRU", because of the similarity of the functions discussed herein, although those skilled in the art will recognize that a DRU communicates with a DAU, whereas an RRU communicates with a base station. In addition, those skilled in the art will recognize that a DAU is monitored and controlled by a remote network operations center ("NOC"), as indicated at bidirectional link 115 in FIG. 1. Such links are typically Ethernet connections or external modems, but can be any form of link suitable for remote monitoring and control. The NOC has the capability to remotely configure the DAU parameter settings which in turn configures the DRU's parameter settings. The NOC can request information from the DAUs. The DAUs can subsequently request information from the DRUs. The information requested includes but is not limited to uplink power, downlink power, optical error rate, gain settings, active carriers, etc.

For the downlink (DL) path, RF input signals 120A through 120n are received at the DAU 105 from one or more base station units (BTS) indicated at 110A through 11 0p.

The RF input signals are separately down-converted, digitized, and converted to baseband (using a Digital Down-Converter) by the DAU. Data streams are then I/Q mapped and framed and specific parallel data streams are then independently serialized and translated to optical signals using pluggable SFP modules, again by the DAU 105. The independently serialized, parallel data streams are then delivered to different DRU's 125A-125k, typically over optical fiber cable arranged, in at least some embodiments, in a ring configuration indicated at connection pairs 140A-145A, or, in other embodiments, a daisy chain configuration. In addition, each DAU can support a plurality of rings with associated DRU's, where the additional rings are indicated by fiber optic pairs up through 140o-145o. It will be appreciated by those skilled in the art that the number of RF inputs, DAU's and DRU's and rings is limited only by network performance factors, such as delay. In addition, as discussed in connection with FIG. 4 herein, the DAS can be further extended by using a ring or daisy-chain of DAU's, each of which supports an arrangement of DRU's and rings as shown in FIG. 1.

One function of the DAU 105 is to determine the direction in which downlinked channels are propagated around the ring. As just one example, the embodiment shown in FIG. 1 is configured to have downlink channels A, B, C and D propagate in a first direction, for example clockwise, and channels E, F, G, and H propagate in the counter direction, although it will be understood that the number of channels propagating in each direction need not be equal, nor adjacent, nor sequential. Likewise, the number of channels received at each DRU is assigned by the DAU and need not be equal, adjacent or sequential, but instead will typically be any configuration that optimizes network utilization.

Figure 2:
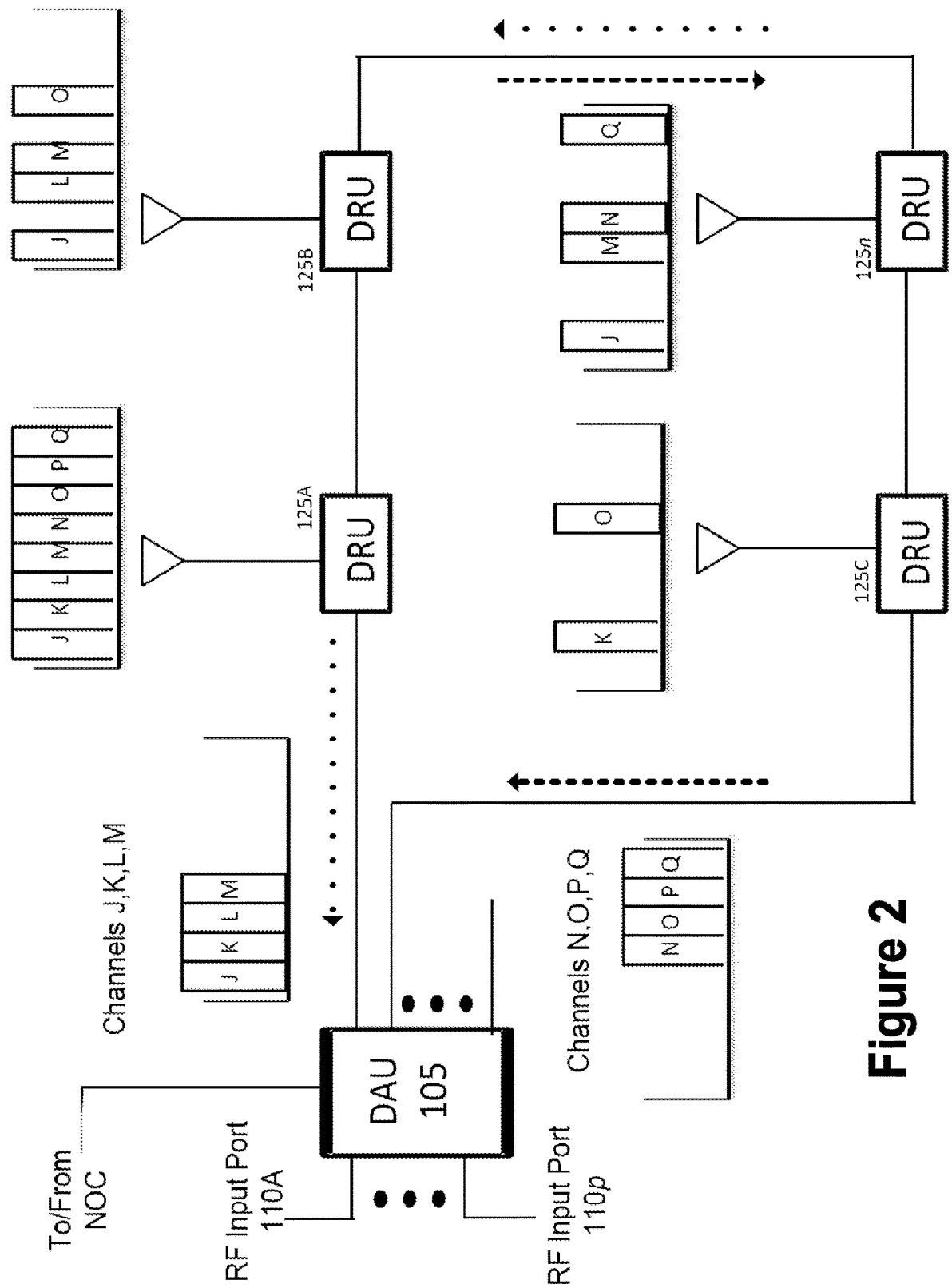
FIG. 2 is a block diagram in accordance with an embodiment of the invention showing the basic structure and an example of a unidirectional, channelized uplink transport, one ring scenario based on having one DAU and four DRUs.

Referring next to FIG. 2, an embodiment of an uplink (UL) path in accordance with the invention can be better appreciated. Channels received at the antenna associated with each DRU are converted into optical signals by each DRU 125A-125k. Optical signals received from the DRU's are de-serialized and de-framed by the DAU 105, and are also up-converted digitally using a Digital Up-Converter implemented within the DAU 105. Each data stream is then independently converted to the analog domain and up-converted to the appropriate RF frequency band, still within the DAU 105 in the illustrated implementation, although this functionality can be separate. The RF signals are then delivered to the appropriate one of a plurality of BTS' 110A-110p. As with the arrangement shown in FIG. 1, the direction of propagation of each channel is controlled by the DAU, with some channels propagating in a clockwise direction and others in a counterclockwise direction. Also as discussed in connection with FIG. 1, while adjacent channels are shown as propagating in the same direction in FIG. 2, this is not required and any channel can be selected to propagate in either direction.

Referring again to FIG. 1, it will be appreciated by those skilled in the art that, in some implementations of a DAS, more than one carrier can exist in each channel, and, as such, a DRU may receive a channel comprising a signal containing two or more carriers, or a wireless operator may have more than one RF carrier per channel allocated to a single base station. This is referred to as a "composite signal". The manner in which a composite downlink signal is managed by the present invention can be better understood with reference to FIG. 1. In such instances, the DAU will receive a composite downlink input signal 130 from, e.g., a first base station 110A belonging to one wireless operator, enters the DAU 105 at the RF input port 120A. Composite signal 130 comprises carriers A-D. A second composite downlink input signal from e.g., a pth base station 110p belonging to the same wireless operator enters DAM at the DAU1 RF input port 120n. Composite signal 135 comprises carriers E-H. The functionality of the DAU 105, and DRU's 125A-125k, respectively, are explained in detail in U.S. Provisional Application Ser. No. 61/374,593, entitled "Neutral Host Architecture for a Distributed Antenna System," filed Aug. 17, 2010, the disclosure of which is hereby incorporated by reference in its entirety for all purposes.

One optical output of DAU 105 is fed to DRU 125A, via bidirectional optical cable 140A. A second optical output of DAU 105 is fed via bidirectional optical cable 145A to DRU3. Similarly, bidirectional optical cables 150, 155 and 160 connect DRU's 125A-n in a ring configuration, such that DRU 125A connects to DRU 125B via cable 150A, DRU 125B connects to DRU 125n via cable 15013, and DRU 125k connects to DRU 125C, or the kth-1 DRU, via cable 150m. This connection facilitates networking of DAU 105, which means that all of Carriers A-H are available within DAU 105 to transport data to DRU's 125A-k depending on software settings within the networked DAU system. Depending upon the embodiment, the software settings within DRU 125A are configured either manually or automatically, such that carriers A-H are present in the downlink output signal 155A at the antenna port of DRU 125A. The presence of all eight carriers means that DRU 125A is potentially able to access the full capacity of both base stations feeding DAU 105. A possible application for DRU 125A is a cafeteria in an enterprise building during the lunch hour where a large number of wireless subscribers are gathered.

DRU 125B is fed by a second optical port of DRU 125A via bidirectional optical cable 150A. The optical cable 150A performs the function of daisy chaining DRU 125A with DRU 12513. As with DRU 125A, the software settings within DRU 125B are configured either manually or automatically such that Carriers A, C, D and F are present in downlink output signal 155E at the antenna port of DRU 1258. The capacity of DRU 125B is set to a much lower value than DRU 125A by virtue of its specific channel settings as controlled by DAU 105. The individual Digital Remote Units have integrated frequency selective DUCs and DDCs with gain control for each carrier. The DAU's can remotely turn on and off the individual carriers via the gain control parameters.

In a similar manner as described previously for DRU 125A, the software settings within DRU 125C are configured either manually or automatically such that Carriers B and F are present in downlink output signal 155C at the antenna port of DRU 125C. Compared to the downlink signal 155B at the antenna port of DRU 12513, the capacity of DRU 125C, which is also configured via its software settings, is much less than the capacity of DRU 125B. DRU 125n is fed by the optical cable 150m connected to the second optical port of the $n^{th}$-1 DRU, shown for simplicity in FIG. 1 as DRU 125C. The software settings within DRU 125n are configured either manually or automatically such that carriers A, D, E and H are present in downlink output signal 155D at the antenna port of DRU 125n. Typically, the capacity of DRU 125n is set to a much lower value than DRU 125A, however, the relative capacity settings of each of DRU's 125A-n can be adjusted dynamically to meet the capacity needs within the coverage zones determined by the physical positions of antennas connected to those DRU's. As noted above, the ring connection is completed by interconnecting DRU 125B and DRU 125n through optical cable 150B. The ring configuration insures that any optical cable breaks will not shut down the daisy chained network. The downlink and uplink signals will be rerouted around the cable break to the respective DRUs.

The present invention facilitates conversion and transport of several discrete relatively narrow RF bandwidths. This approach allows conversion of only those multiple specific relatively narrow bandwidths which carry useful or specific information. This approach also allows more efficient use of the available optical fiber transport bandwidth for neutral host applications, and allows transport of more individual operators' band segments over the optical fiber. As disclosed in U.S. Provisional Application Ser. No. 61/374,593, entitled "Neutral Host Architecture for a Distributed Antenna System," filed Aug. 17, 2010 together with U.S. Provisional Application Ser. No. 61/382,836, entitled "Remotely Reconfigurable Distributed Antenna System and Methods", filed Sep. 14, 2010, both assigned to the assignee of the present invention, and also referring to FIG. 1 of the instant patent application, Digital Up Converters located within the DRU can be dynamically reconfigured as the result of commands from the NOC to transport from the DAU input to any specific DRU output any specific narrow frequency band or bands, RF carriers or RF channels which are available at the respective RF input port of either DAU. This capability is illustrated in FIG. 1 where only specific frequency bands or RF carriers appear at the output of a given DRU. More specifically, through commands received from the NOC, the FPGA's in the DAU and one or more of the associated DRU's can be reprogrammed or reconfigured to convert and transport only the desired narrow bandwidths.

A related capability of the present invention is that not only can the Digital Up Converters located within each DRU be configured to transport any specific narrow frequency band from the DAU input to any specific DRU output, but also the Digital Up Converters within each DRU can be configured to transport any specific time slot or time slots of each carrier from the DAU input to any specific DRU output. The carriers and time slots are monitored by the DAU by filtering the signals and performing power detection of the individual time slots, which information can be conveyed to the NOC as desired. Then, as with the Digital Up Converters, the Field Programmable Gate Arrays (FPGA) in the DAU or DRU can be dynamically reconfigured by commands received from the NOC in a manner analogous to software programmability. The DAU detects which carriers and corresponding time slots are active. This information is relayed to the individual DRUs via the management control and monitoring protocol software. This information is then used, as appropriate, by the DRUs for turning off and on individual carriers and their corresponding time slots.

Data transport between the Base Station and the subscribers is typically asymmetrical, whereby the downlink data rate is higher than the uplink rate. The ring network configuration of Daisy Chained DRUs can exploit this data rate asymmetry to maximize the data transport on the optical fibers 150A-150m.

The present invention balances the bidirectional data rate on the optical fibers so as to increase the maximum achievable data rate on the ring network of DRUs. The individual downlink channels are transmitted in a unidirectional sense along the ring network. Referring to FIG. 1, downlink channels A, B, C, and D are transmitted in a clockwise sense around the ring of DRU's 125A-k. On the other hand, downlink channels E, F, G and H are transmitted in a counterclockwise sense around the ring of DRUs. Referring to FIG. 2, the uplink channels J, K, L and M are transmitted in a counterclockwise sense whereas uplink channels N, O, P and Q are transmitted in a clockwise sense around the ring of DRUs. If the downlink and uplink data rates were the same, there would be no advantage in the transport mechanism. However, if the data transport is asymmetrical between the downlink and uplink then a significant advantage can be gained. For example, for a factor of two difference between the downlink and uplink data rates, a 4/3 factor increase in data transport can be achieved. The larger the asymmetry between the downlink and uplink data rates, the larger will be the increase in data transport using the unidirectional channel transport mechanism around the ring.

Referring again to FIG. 1, a further embodiment in accordance with another aspect of the present invention may be better understood. In the event that there is a significant change in asymmetry between the downlink and uplink data rates and/or if there is a change in channel complement at the BTS, the Management Control module [discussed in connection with FIG. 7 herein] which is typically comprised within each DAU is able to automatically and adaptively re-allocate data transport resources on the clockwise direction of the ring and on the counterclockwise direction of the ring to maximize the overall transport capacity. As stated previously, the larger the degree of asymmetry between uplink and downlink data rates for a particular DAU, the higher the increase in data transport using the unidirectional channel transport mechanism around the ring. If there is more than one DAU present, in an embodiment one DAU is designated a Master DAU by the NOC, and the Management Control module located in the Master DAU makes decisions to optimize the overall transport capacity. In the event the master DAU fails, the NOC can designate another DAU as master. Alternatively, any suitable failover algorithm can be implemented.

Figure 3:
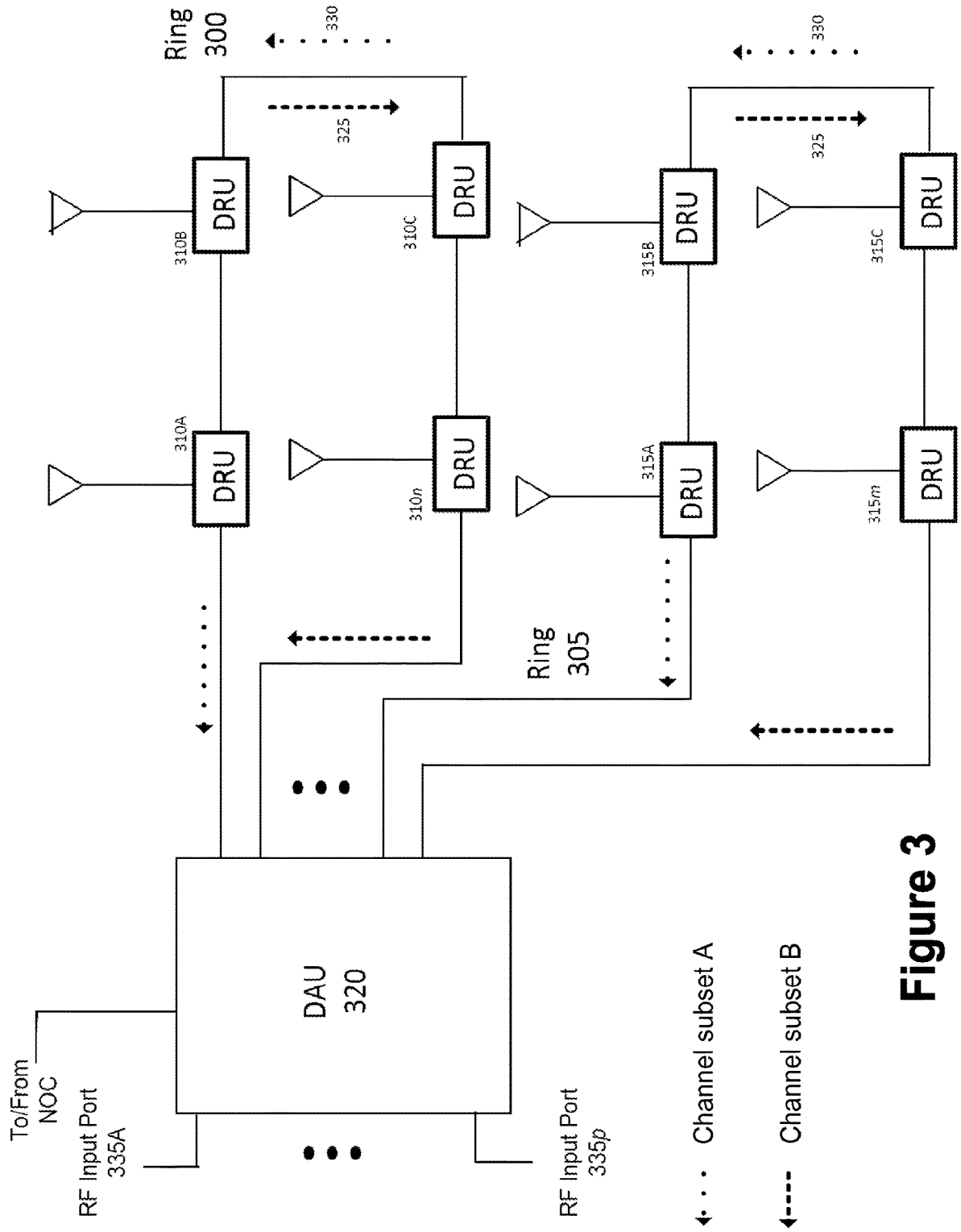
FIG. 3 is a block diagram in accordance with an embodiment of the invention showing the basic structure and an example of a unidirectional, channelized uplink transport, two ring scenario based on having one DAU and eight DRUs.

Referring to FIG. 3, an alternative embodiment of the present invention wherein a single DAU controls a plurality of rings, each comprising a plurality of daisy-chained DRU's, can be better understood. In FIG. 3, two daisy-chained rings, indicated at 300 and 305, are shown although the number of rings could be greater and is determined mainly as a matter of design preference up to limits imposed by network performance. The rings each link a plurality of DRU's 310A-$n$ and 315A-$m$, to a single DAU 320. The directional flow of the data transport is shown as the dashed lines 325 and dotted lines 330. The downlink channels available from the plurality of DRU's are divided into two subsets which flow in opposite directions around the two daisy-chained rings. The uplink channels are transported in a similar fashion. The channels are grouped into the two subsets so as to maximize the data transport to and from the DRUs. The DAU in turn communicates with one or more BTS's via RF Ports 335A p.

Heuristic algorithms may be used to allocate RF channel data in a Dual-ring DAS. For FIG. 3, there are two fibre rings R1, R2 (clockwise and counter clockwise) and a set T of n≥2 independent RF channels Ki, 1≤i≤n (including uplink and downlink). A channel Ki requires a bandwidth of b(Ki) to transport on a fibre ring. A time-bounded algorithm exists which obtains a schedule having the optimal bandwidth allocation (i.e. the maximum aggregate bandwidth of each ring is as small as possible). A large number of advanced heuristic algorithms have been developed to solve such scheduling optimization problems. Some examples are genetic algorithm, evolutionary algorithm, greedy search, Tabu search, harmony search, simulated annealing, ant colony optimization, etc. For purposes of simplicity and clarity, a simple heuristic algorithm for two rings is described here, although the number of rings is not limited to two.

The algorithm begins by sorting the channels Ki decreasingly by bandwidth b(Ki). Then it schedules the channel in such a way that each channel is assigned to the ring which has the smaller aggregate bandwidth. The formal description of the algorithm follows.

Input: T=set of n independent channels Ki with required bandwidth b(Ki), $1 \leq i \leq n$.

Output: $L_1$, $L_2$ and $D_1$, $D_2$. Lj is the set of channels schedule on ring Rj, and $D_j$ is the maximum aggregate bandwidth of ring Rj, Dj=Dj=($\Sigma$b(J), J$\varepsilon L_j$), $1 \leq j \leq 2$.

Algorithm (T, L, D)

Step 1 (initialize Ki and $D_1$, $D_2$) Sort Ki such that b(Ki)$\leq$b(Ki$_{+1}$), $1 \leq i \leq n-1$. $D_1 \leftarrow 0$, $D_2 \leftarrow 0$.

Step 2 (Schedule a channel)

For i=1 to n, step 1 do

If $D_1 \leq D_2$, then [assign Ki onto $L_1$, $D_1 \leftarrow D_1$+b(Ki)].

else [ assign Ki onto $L_2$, $D_2 \leftarrow D_2$+b(Ki)].

Figure 4:
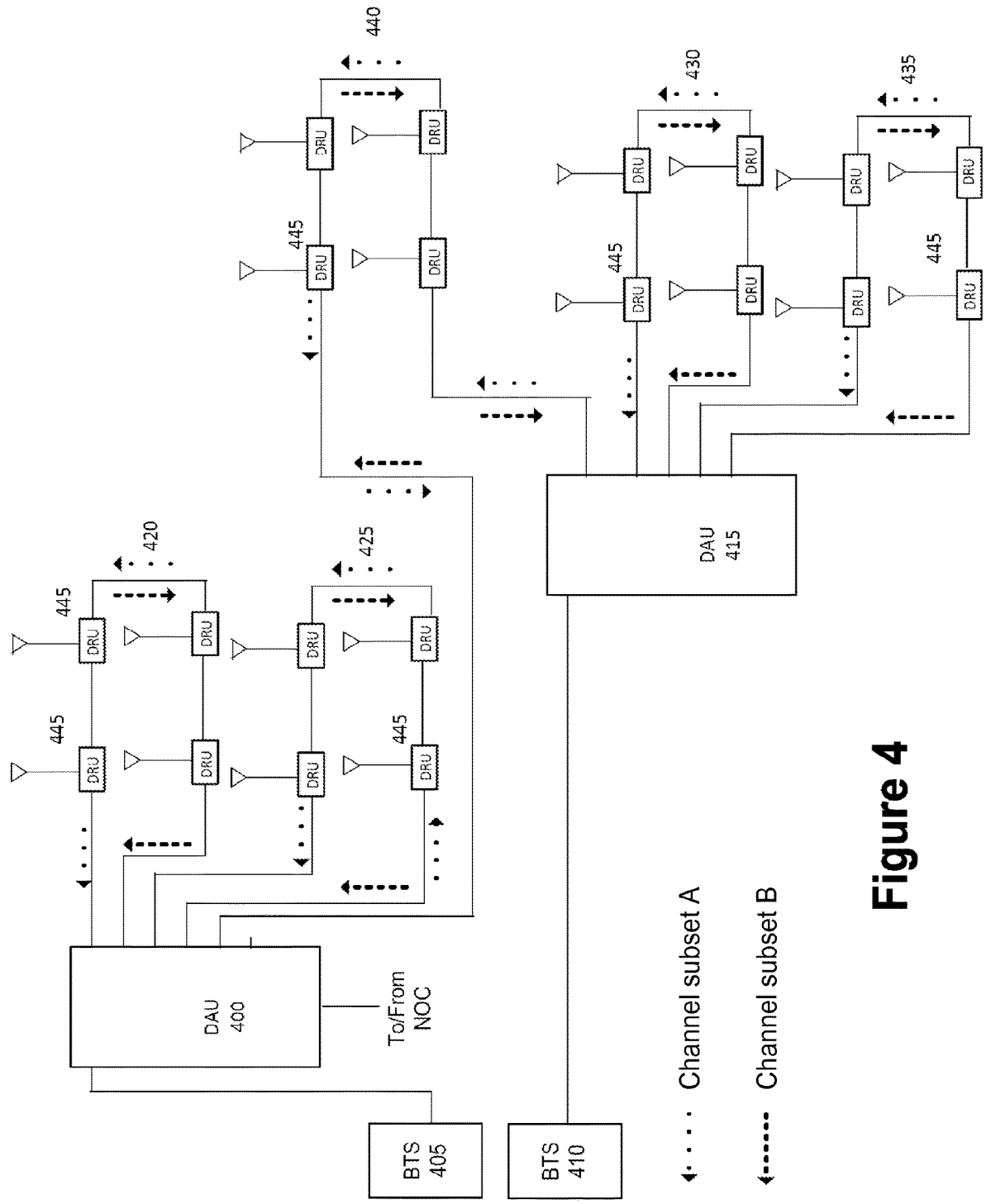
FIG. 4 is a block diagram in accordance with an embodiment of the invention showing the basic structure and an example of a unidirectional channelized uplink or downlink transport. This example of a five ring scenario comprises two DAUs and twenty DRUs.
Figure 8:
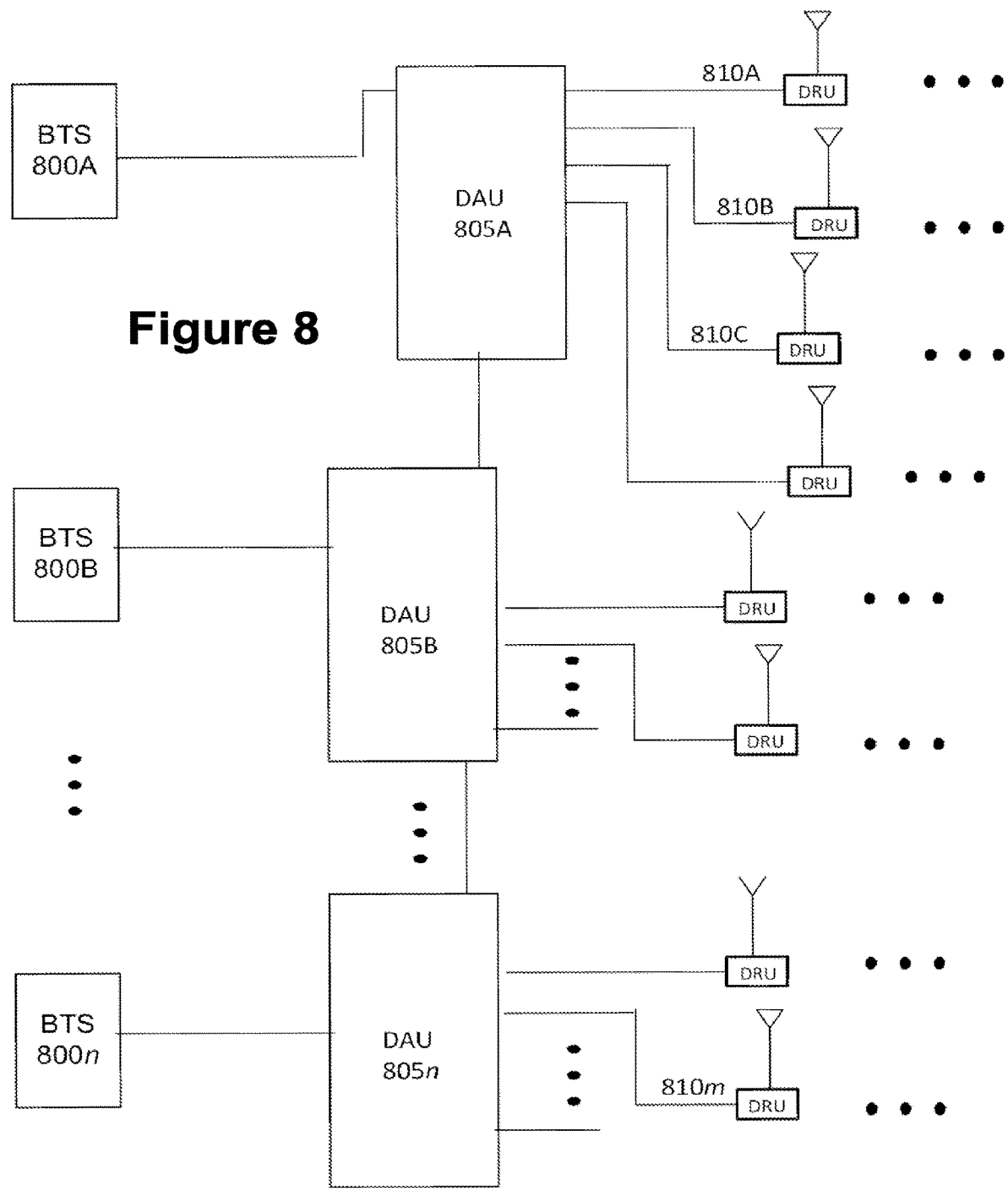
FIG. 8 illustrates in block diagram form an embodiment of a DAS according to an aspect of the invention, including daisy-chained DAU's.

Referring next to FIG. 4, a still further an alternative embodiment of the present invention may be understood. The arrangement illustrated in FIG. 1 comprised downlink signals from two separate base stations belonging to the same wireless operator entering the DAU 105 at input ports 110A and 110p, respectively. In the embodiment of FIG. 4, a first composite signal enters a first DAU 400 at that DAU's RF input port from a base station 405, and a second composite downlink input signal from, e.g., a second base station 410 belonging to a different wireless operator enters DAU 415 at that second DAU's RF input port. DAU 400 directly supports two rings 420 and 425, DAU 415 directly supports two rings 430 and 435, and a ring 440 is shared between DAU 400 and DAU 405. Each of the rings comprises daisy-chained DRU's generally indicated at 445 and connected via, for example, fiber optic links, as discussed in connection with FIG. 1. It will be noted that channels A are transported in the opposite sense as channels B. The downlink channels in subset A are transported counterclockwise around each ring, whereas the channels in subset B are transported in a clockwise sense around each ring. In this embodiment, signals belonging to both the first operator and the second operator are converted and transported to the DRU's 445 on ring 440 because DAU 400 and DAU 405 are daisy-chained through the fiber optic cable 440. This embodiment provides an example of a neutral host wireless system, where multiple wireless operators share a common infrastructure comprised of DAU 400, DAU 415, and DRU's 445. All the previously mentioned features and advantages accrue to each of the two wireless operators. It will further be appreciated that, while FIG. 4 illustrates only two DAU's linked in daisy-chain style, it is possible to daisy chain a larger plurality of DAU's, and the daisy-chained DAU's can also be configured in a ring configuration similar to the manner in which the DRU's are connected. This arranged is illustrated in FIG. 8, below.

As disclosed in U.S. Provisional Application Ser. No. 61/374,593, entitled "Neutral Host Architecture for a Distributed Antenna System," filed Aug. 17, 2010 and again referring to FIG. 1 of the instant patent application, the Digital Up Converters present in the DRU's of the present invention can be programmed to process various signal formats and modulation types including FDMA, CDMA, TDMA, OFDMA and others. Also, the Digital Up Converters present in the respective DRUs can be programmed to operate with signals to be transmitted within various frequency bands subject to the capabilities and limitations of the system architecture disclosed in U.S. Provisional Application Ser. No. 61/374,593, mentioned above. In one embodiment of the present invention where a wideband CDMA signal is present within, e.g., the bandwidth corresponding to a first carrier at the input port to DAU 105, the transmitted signal at the antenna ports of DRU 125A, DRU 125B and DRUk will be a wideband CDMA signal which is virtually identical to the signal present within the bandwidth corresponding to that first carrier at the input port to DAU 105.

As disclosed in U.S. Provisional Application Ser. No. 61/374,593, again identified above, and also referring to FIG. 1 of the instant patent application, it is to be understood that the Digital Up Converters present in the respective DRUs can be programmed to transmit any desired composite signal format to each of the respective DRU antenna ports. As an example, the Digital Up Converters present in DRU 125A and DRU 125B can be dynamically software-reconfigured as described previously so that the signal present at the antenna port of DRU 125A would correspond to the spectral profile shown in FIG. 1 as 155A and also that the signal present at the antenna port of DRU 125B would correspond to the spectral profile shown in FIG. 1 as 155B. The application for such a dynamic re-arrangement of DRU capacity would be e.g., if a company meeting were suddenly convened in the area of the enterprise corresponding to the coverage area of DRU 125B.

Referring again to FIG. 2, another embodiment of the Distributed Antenna System of the present invention can be better understood. As disclosed in the aforementioned U.S. Provisional Application Ser. No. 61/374,593, and also as shown in FIG. 2, the optical ring transport mechanism can be implemented with regard to uplink signals. As discussed previously with regard to downlink signals and by referring to FIG. 1, the uplink system shown in FIG. 2 is mainly comprised of DAU 105, together with DRU's 125A-125k. In a manner similar to the downlink operation explained by referring to FIG. 1, the operation of the uplink system shown in FIG. 2 can be understood as follows.

The Digital Down Converters present in each of DRU's 125A-k are dynamically software-configured as described previously so that uplink signals of the appropriate desired signal format(s) present at the receive antenna ports of the respective DRU's 125A-125k are selected based on the desired uplink band(s) to be processed and filtered, converted and transported to the appropriate uplink output port of DAU 105. The DAU and DRUs frame the individual data packets corresponding to their respective radio signature using the Common Public Radio Interface (CPRI) standard. Other Interface standards are applicable provided they uniquely identify data packets with respective DRUs. Header information is transmitted along with the data packet which indentifies the DRU and DAU that corresponds to the individual data packet.

In one example for the embodiment shown in FIG. 2, DRU's 125A and 125C are configured to receive uplink signals within the Channel K bandwidth, whereas DRU 125B and DRU 125n are both configured to reject uplink signals within the Channel K bandwidth. When DRU 125C receives a strong enough signal at its receive antenna port within the Channel K bandwidth to be properly filtered and processed, the Digital Down Converters within DRU 125C facilitate processing and conversion. Similarly, when DRU 125A receives a strong enough signal at its receive antenna port within the Channel K bandwidth to be properly filtered and processed, the Digital Down Converters within DRU 125A facilitate processing and conversion. The signals from DRU 125A and DRU 125C are combined based on the active signal combining algorithm, and are fed to the base station connected to the uplink output port of DAU 105. The term simulcast is frequently used to describe the operation of DRU 125A and DRU 125C with regard to uplink and downlink signals within Channel K bandwidth. The term Flexible Simulcast refers to the fact that the present invention supports dynamic and/or manual rearrangement of which specific DRU are involved in the signal combining process for each Channel bandwidth.

Referring still to FIG. 2, the Digital Down Converters present in DRU 125A are configured to receive and process signals within Channel J-Q bandwidths. The Digital Down Converters present in DRU 1256 are configured to receive and process signals within Channel J, L, M and O bandwidths. The Digital Down Converters present in DRU 125C are configured to receive and process signals within Channel K and O bandwidths. The Digital Down Converters present in DRU 125*n* are configured to receive and process signals within Channel J, M, N and Q bandwidths. The respective high-speed digital signals resulting from processing performed within each of the four DRU are routed to the DAU. As described previously, the uplink signals from the four DRUs are combined within the respective DAU corresponding to each base station.

In summary, the Reconfigurable Distributed Antenna System of the present invention described herein efficiently conserves resources and reduces costs. The reconfigurable system is adaptive or manually field-programmable, since the algorithms can be adjusted like software in the digital processor at any time.

Figure 5:
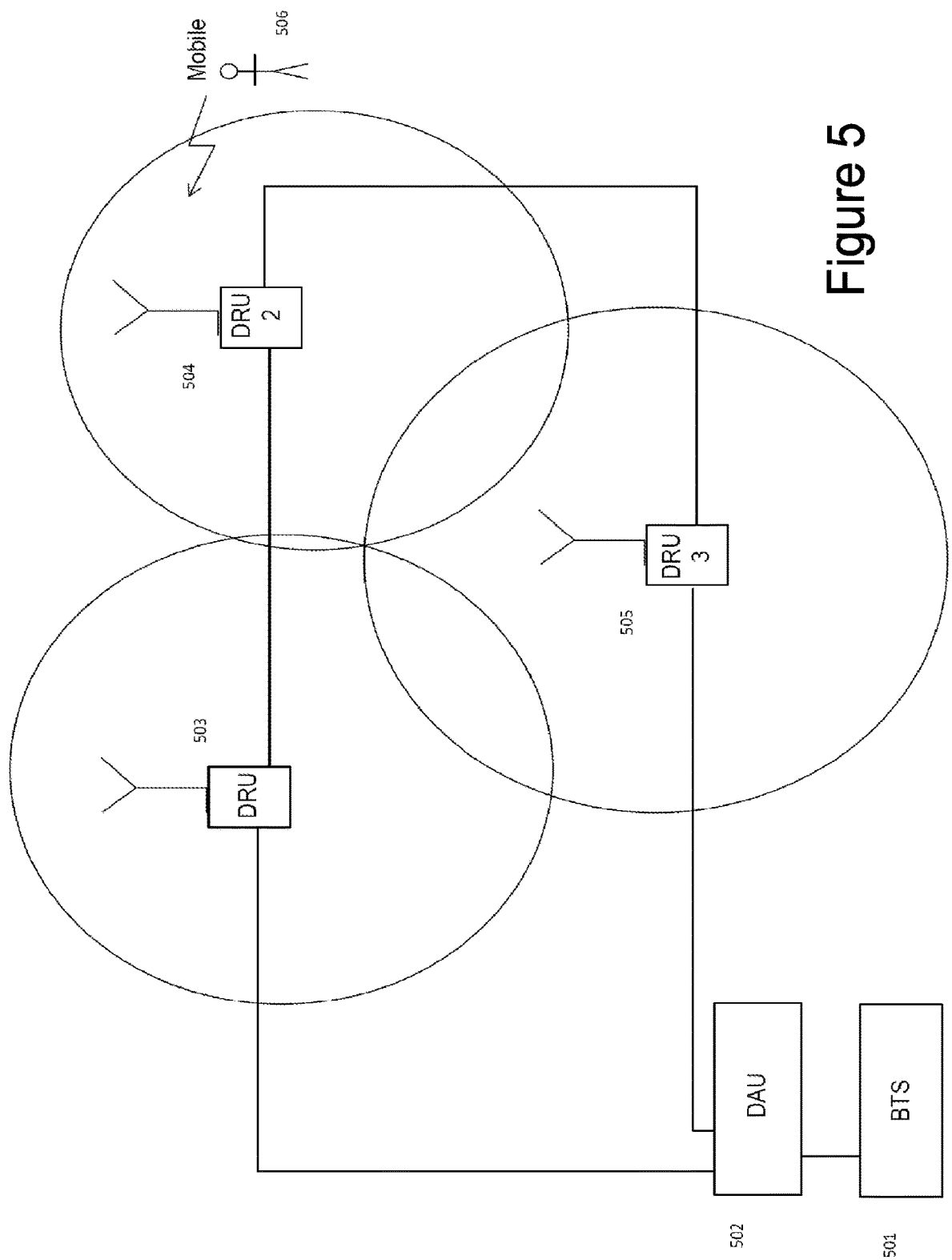
FIG. 5 illustrates an embodiment of a cellular network system employing multiple DRUs according to the present invention.

Referring next to FIG. 5, an alternative embodiment of the present invention may be better understood. FIG. 5 provides a daisy chain example of a distributed antenna system (DAS). Each DRU has a coverage radius that can be adjusted based on the power transmission from that particular remote unit. The DAU controls the various DRU's transmission power and can optimize the overall coverage zone. In the illustrated embodiment, DAU 502, again under the control of a NOC (not shown), is associated with a base station 501 and in turn interfaces with three DRU's 503, 504 and 505. A user 506 with a mobile device is provided relatively uniform coverage throughout the area covered by the three DRU's.

Figure 6:
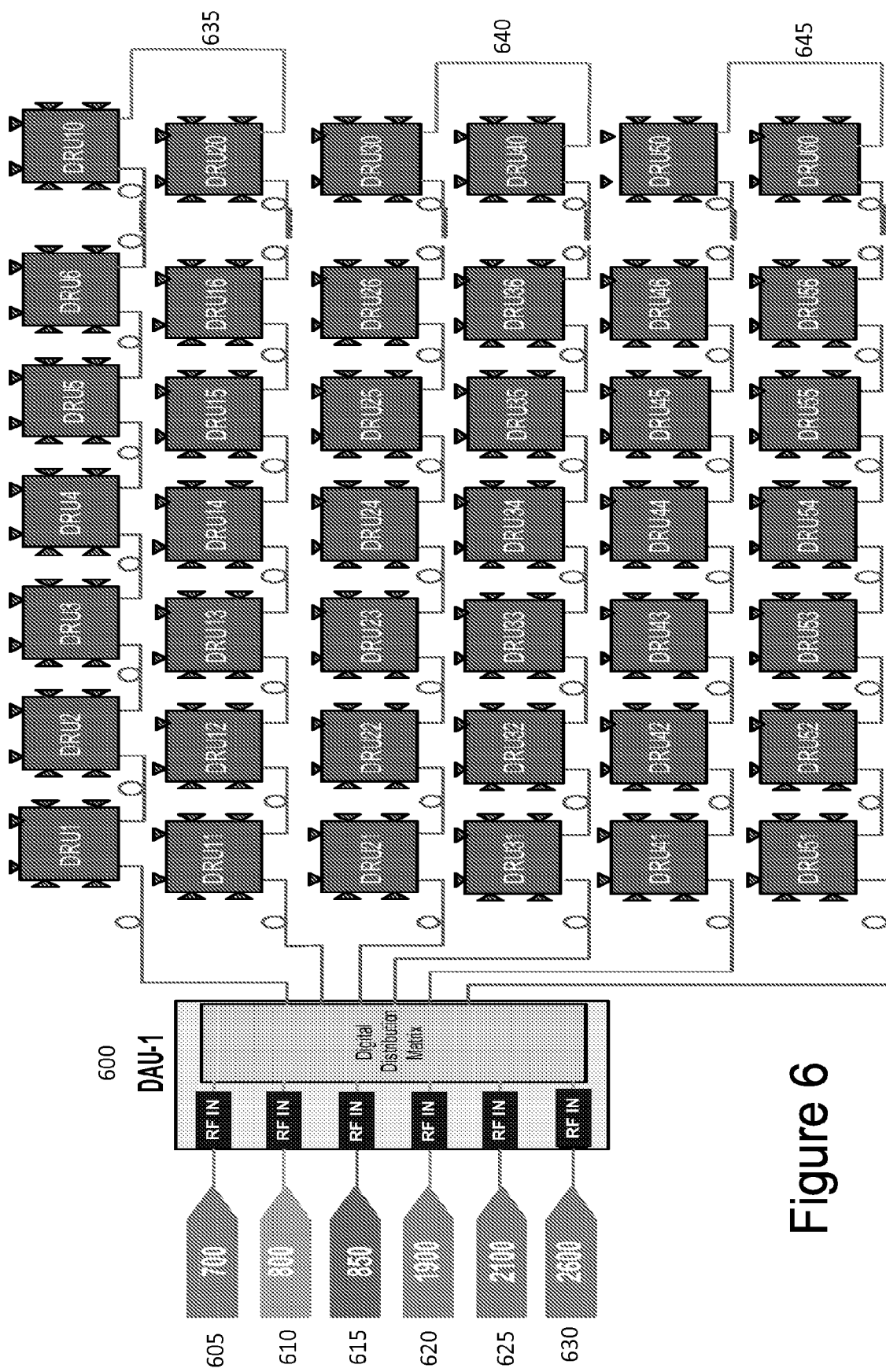
FIG. 6 illustrates an embodiment of a multi-band system employing six different services operating in different frequency channels with multiple DRUs according to the present invention.

Referring next to FIG. 6, a still further alternative embodiment may be better appreciated. FIG. 6 shows an embodiment of a multi-band system illustrating one DAU supporting up to six different services operating at different frequency bands, with three optical rings of DRU's 1-60. The input frequency bands 605-630 (here denoted as six frequency bands at 700, 800, 850, 1900, 2100 and 2600 MHz) are input into the DAU 600 from the BTS's (not shown). The DAU includes, among other functionalities discussed herein, an RF IN portion for each band, and a digital distribution matrix for distributing the frequency bands to a plurality of DRU's, indicated as DRU1-DRU60, daisy-chained along three separate rings 635, 640 and 645 for achieving the desired coverage. The frequency bands are transported to either all or a subset of DRUs. The particular number of frequency bands, DAU's, DRU's and rings is exemplary only, and can, in practice, be any number appropriate to the performance capabilities and needs of the network.

Figure 7:
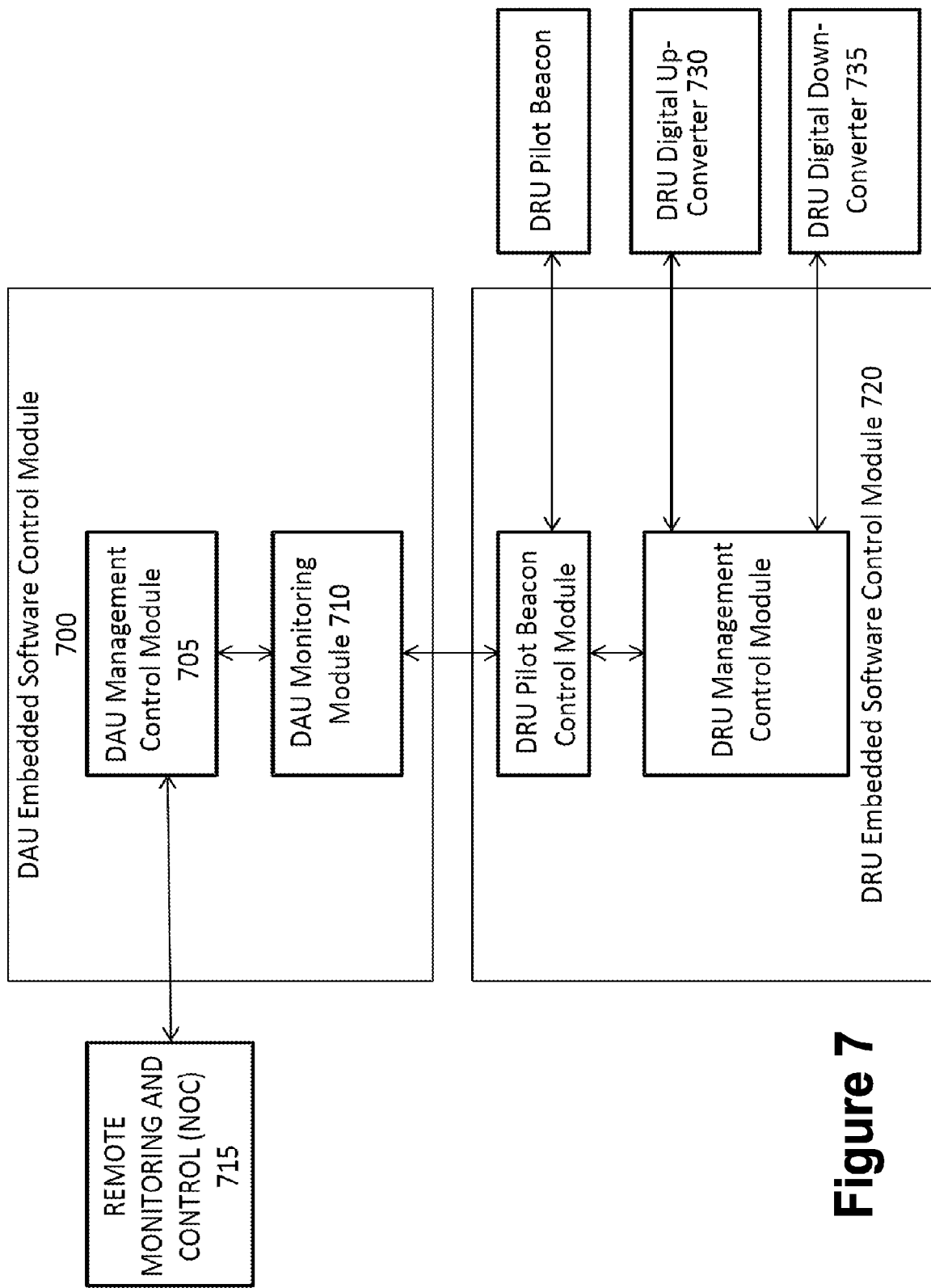
FIG. 7 illustrates in block diagram form the interaction between the DAU embedded software control module and the DRU embedded software control module.

Referring next to FIG. 7 that illustrates embedded software control modules, the software embedded in the DAU and DRU, which controls the operation of key functions of these devices, can be better understood. In particular, the DAU embedded software control module 700 comprises a DAU Management Control Module 705 and a DAU monitoring module 710. The DAU Management Control Module 705 communicates with the NOC 715, and also the DAU monitoring module 710. One such key function is determining and/or setting the appropriate amount of radio resources (such as RF carriers, CDMA codes or TDMA time slots) assigned to a particular DRU or group of DRUs to meet desired capacity and throughput objectives. As noted previously, the NOC 715 monitors the DAS operation and sends commands to the DAU's for configuring various functions of the DRU's as well as the DAU, in at least some embodiments.

The DAU Monitoring module, in addition to other functions, detects which carriers and corresponding time slots are active for each DRU. The DAU Management Control module communicates with the DRU Embedded Software Control module 720 over a fiber optic link control channel via a control protocol. In an embodiment, the control protocol comprises headers together with packets of data, such that both control information and data are transmitted to the DRU's together as a message. DRU functions or features that the header would control in the DRU are typically implementation specific and can include, among other things, measuring uplink and downlink power, measuring gain of uplink and downlink, and monitoring alarms in the DRU.

In turn, the DRU Management Control module 725 within the DRU Embedded Software Control Module sets the individual parameters of all the DRU Digital Up-Converters 730 to enable or disable specific radio resources from being transmitted by a particular DRU or group of DRUs, and also sets the individual parameters of all the DRU Digital Down-Converters 735 to enable or disable specific radio resources from being transmitted by a particular DRU or group of DRUs. In addition, the DRU Embedded Software Control Module comprises a DRU Pilot Beacon Control Module 740, which communicates with a DRU Pilot Beacon 745.

Referring next to FIG. 8, an embodiment of a daisy-chained configuration of DAU's is illustrated, together with a daisy-chained configuration of DRU's. In an embodiment, a plurality of base stations 800A-800*n* are each associated with one of DAU's 805A-*n*. The DAU's are daisy-chained, and each DAU communicates with one or more daisy-chains 810A-810*m* of DRU's which may or may not be arranged in a ring configuration. It will be appreciated that the DAU's can also be configured in a ring configuration, as discussed above.

An algorithm operating within the DAU Monitoring module which detects which carriers and corresponding time slots for each carrier are active for each DRU provides information to the DAU Management Control module to help identify when, e.g., a particular downlink carrier is loaded by a percentage greater than a predetermined threshold whose value is communicated to the DAU Management Control module by the DAU's Remote Monitoring and Control function 715. If that occurs, the DAU Management Control module can adaptively modify the system configuration to begin to deploy, typically although not necessarily slowly, additional radio resources (such as RF carriers, CDMA codes or TDMA time slots) for use by a particular DRU which need those radio resources within its coverage area. At the same time, usually the DAU Management Control module adaptively modifies the system configuration to begin to remove, again typically slowly, certain radio resources (such as RF carriers, CDMA codes or TDMA time slots) for use by a particular DRU where that DRU no longer needs those radio resources within its coverage area.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

APPENDIX I

Glossary of Terms

ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
BTS Base Transceiver System or Base Station
CDMA Code Division Multiple Access
CFR Crest Factor Reduction
DAC Digital to Analog Converter
DAU Digital Access Unit
DET Detector
DHMPA Digital Hybrid Mode Power Amplifier
DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
PN Pseudo-Noise
QAM Quadrature Amplitude Modulation
QPSK Quadrature Phase Shift Keying
RF Radio Frequency
RRH Remote Radio Head
RRU Remote Radio Head Unit
SAW Surface Acoustic Wave Filter
UMTS Universal Mobile Telecommunications System
UPC Up Converter
WCDMA Wideband Code Division Multiple Access
WLAN Wireless Local Area Network

What is claimed is:

1. A system to transport wireless communications, comprising:
   a digital access unit;
   a plurality of signal sources, including at least a first signal source and a second signal source;
   a plurality of remote units, including at least a first remote unit and a second remote unit; wherein the digital access unit comprises a plurality of interfaces to communicatively couple the digital access unit to the plurality of signal sources;
   wherein the digital access unit is configured to receive a plurality of radio resources from the first signal source and the second signal source;
   wherein the digital access unit is configured to send a digital representation of a first set of radio resources to the first remote unit at a first point in time, the first set of radio resources for transmission at an antenna of the first remote unit;
   wherein the digital access unit is configured to send a digital representation of a second set of radio resources to the first remote unit at a second point in time, the second set of radio resources for transmission at the antenna of the first remote unit;
   wherein a number of radio resources in the first set of radio resources is different from a number of radio resources in the second set of radio resources at least based on dynamic load balancing and resource management; and
   wherein the digital access unit is configured to receive digital signals from each of the plurality of remote units.

2. The system of claim 1, wherein the system determines load and selects traffic paths based at least in part on the determined load.

3. The system of claim 1, wherein the dynamic load balancing and resource management controls routes from a digital access unit port to a remote unit port.

4. The system of claim 1, wherein the dynamic load balancing and resource management dynamically adjusts a capacity of at least the first remote unit.

5. The system of claim 1, wherein the dynamic load balancing and resource management uses uplink summing to combine signals from at least the first and second remote units.

6. The system of claim 1, wherein the dynamic load balancing and resource management uses steering to route signal traffic in the system.

7. The system of claim 1, wherein the dynamic load balancing and resource management uses capacity steering to route signal traffic in the system.

8. The system of claim 1, wherein the dynamic load balancing and resource management uses network capacity to route signal traffic in the system.

9. The system of claim 1, wherein the first remote unit is a low power radio capable of using multiple frequency bands.

10. The system of claim 1, wherein the digital signals communicated between the digital access unit and the remote units are sent via optical cables.

11. The system of claim 1, wherein the remote units are automatically configured by the system.

12. A method for wireless communications comprising:
   receiving, at a digital access unit, a plurality of radio resources from a first signal source and a second signal source, wherein the digital access unit comprises a plurality of interfaces to communicatively couple the digital access unit to a plurality of signal sources;

sending, by the digital access unit, a digital representation of a first set of radio resources to a first remote unit at a first point in time, the first set of radio resources for transmission at an antenna of the first remote unit; and sending, by the digital access unit, a digital representation of a second set of radio resources to the first remote unit at a second point in time, the second set of radio resources for transmission at the antenna of the first remote unit, wherein a number of radio resources in the first set of radio resources is different from a number of radio resources in the second set of radio resources at least based on dynamic load balancing and resource management.

13. The method of claim 12, further comprising determining a load and selecting traffic paths based at least in part on the determined load.

14. The method of claim 12, wherein the dynamic load balancing and resource management controls routes from a digital access unit port to a remote unit port.

15. The method of claim 12, wherein the dynamic load balancing and resource management dynamically adjusts a capacity of at least the first remote unit.

16. The method of claim 12, wherein the dynamic load balancing and resource management uses uplink summing to combine signals from at least the first and a second remote unit.

17. The method of claim 12, wherein the dynamic load balancing and resource management uses steering to route signal traffic.

18. The method of claim 12, wherein the dynamic load balancing and resource management uses capacity steering to route signal traffic.

19. The method of claim 12, wherein the dynamic load balancing and resource management uses network capacity to route signal traffic.

20. The method of claim 12, wherein the first remote unit is a low power radio capable of using multiple frequency bands.

21. The method of claim 12, wherein the signals communicated between the digital access unit and remote units are sent via optical cables.

22. The method of claim 12, further comprising automatically configuring remote units.

* * * * *

UNITED STATES PATENT AND TRADEMARK OFFICE
CERTIFICATE OF CORRECTION

PATENT NO. : 11,006,343 B2
APPLICATION NO. : 16/410860
DATED : May 11, 2021
INVENTOR(S) : Shawn Patrick Stapleton et al.

Page 1 of 1

It is certified that error appears in the above-identified patent and that said Letters Patent is hereby corrected as shown below:

In the Claims

Column 16, Claim 21, Line 19, please delete "the" after wherein.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*